(12) United States Patent
Yamazaki et al.

(10) Patent No.: US 10,453,964 B2
(45) Date of Patent: Oct. 22, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/661,307

(22) Filed: Jul. 27, 2017

(65) Prior Publication Data

US 2017/0323976 A1 Nov. 9, 2017

Related U.S. Application Data

(63) Continuation of application No. 15/177,480, filed on Jun. 9, 2016, now Pat. No. 9,728,651, which is a (Continued)

(30) Foreign Application Priority Data

Dec. 18, 2009 (JP) .................................. 2009-288428

(51) Int. Cl.
*H01L 29/786* (2006.01)
*H01L 21/02* (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC ........... H01L 29/7869; H01L 29/66969; H01L 29/24; H01L 21/02554; H01L 21/02565
See application file for complete search history.

(56) References Cited

U.S. PATENT DOCUMENTS 5,528,032 A 6/1996 Uchiyama
5,719,065 A 2/1998 Takemura et al.
(Continued)

FOREIGN PATENT DOCUMENTS

EP 1209748 A 5/2002
EP 1443130 A 8/2004
(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
(Continued)

*Primary Examiner* — Joseph C. Nicely
(74) *Attorney, Agent, or Firm* — Robinson Intelligent Property Law Office; Eric J. Robinson

(57) ABSTRACT

A transistor including an oxide semiconductor, which has good on-state characteristics, and a high-performance semiconductor device including a transistor capable of high-speed response and high-speed operation. In the transistor including an oxide semiconductor, oxygen-defect-inducing factors are introduced (added) into an oxide semiconductor layer, whereby the resistance of a source and drain regions are selectively reduced. Oxygen-defect-inducing factors are introduced into the oxide semiconductor layer, whereby oxygen defects serving as donors can be effectively formed in the oxide semiconductor layer. The introduced oxygen-
(Continued)

defect-inducing factors are one or more selected from titanium, tungsten, and molybdenum, and are introduced by an ion implantation method.

3 Claims, 13 Drawing Sheets

Related U.S. Application Data continuation of application No. 14/964,898, filed on Dec. 10, 2015, now Pat. No. 9,378,980, which is a continuation of application No. 12/968,338, filed on Dec. 15, 2010, now Pat. No. 9,240,488.

(51) Int. Cl.
| | | |
|---|---|---|
| H01L 21/425 | (2006.01) | |
| H01L 21/426 | (2006.01) | |
| H01L 21/8234 | (2006.01) | |
| H01L 29/24 | (2006.01) | |
| H01L 29/36 | (2006.01) | |
| H01L 29/66 | (2006.01) | |

(52) U.S. Cl.
CPC ...... *H01L 21/02631* (2013.01); *H01L 21/425* (2013.01); *H01L 21/426* (2013.01); *H01L 21/823418* (2013.01); *H01L 29/24* (2013.01); *H01L 29/36* (2013.01); *H01L 29/66969* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,817,548 | A | 10/1998 | Noguchi et al. |
| 5,943,593 | A | 8/1999 | Noguchi et al. |
| 6,087,679 | A | 7/2000 | Yamazaki et al. |
| 6,184,068 | B1 | 2/2001 | Ohtani et al. |
| 6,294,274 | B1 | 9/2001 | Kawazoe et al. |
| 6,563,174 | B2 | 5/2003 | Kawasaki et al. |
| 6,632,709 | B2 | 10/2003 | Ayres et al. |
| 6,727,522 | B1 | 4/2004 | Kawasaki et al. |
| 6,867,431 | B2 | 3/2005 | Konuma et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,205,640 | B2 | 4/2007 | Yoshioka et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,598,520 | B2 | 10/2009 | Hirao et al. |
| 7,674,650 | B2 | 3/2010 | Akimoto et al. |
| 7,727,865 | B2 | 6/2010 | Ichinose et al. |
| 7,732,819 | B2 | 6/2010 | Akimoto et al. |
| 7,804,088 | B2 | 9/2010 | Tanaka et al. |
| 7,804,091 | B2 | 9/2010 | Takechi et al. |
| 7,829,444 | B2 | 11/2010 | Yabuta et al. |
| 7,884,360 | B2 | 2/2011 | Takechi et al. |
| 7,993,964 | B2 | 8/2011 | Hirao et al. |
| 8,003,981 | B2 | 8/2011 | Iwasaki et al. |
| 8,026,506 | B2 | 9/2011 | Shiino et al. |
| 8,049,225 | B2 | 11/2011 | Yamazaki et al. |
| 8,063,421 | B2 | 11/2011 | Kang et al. |
| 8,093,589 | B2 | 1/2012 | Sugihara et al. |
| 8,129,714 | B2 | 3/2012 | Yano et al. |
| 8,143,678 | B2 | 3/2012 | Kim et al. |
| 8,158,976 | B2 | 4/2012 | Son et al. |
| 8,164,090 | B2 | 4/2012 | Iwasaki et al. |
| 8,164,700 | B2 | 4/2012 | Hatta et al. |
| 8,193,045 | B2 | 6/2012 | Omura et al. |
| 8,202,365 | B2 | 6/2012 | Umeda et al. |
| 8,232,124 | B2 | 7/2012 | Takechi et al. |
| 8,314,032 | B2 | 11/2012 | Kawamura et al. |
| 8,319,214 | B2 | 11/2012 | Imai |
| 8,384,076 | B2 | 2/2013 | Park et al. |
| 8,384,077 | B2 | 2/2013 | Yano et al. |
| 8,395,931 | B2 | 3/2013 | Yamazaki et al. |
| 8,399,882 | B2 | 3/2013 | Jeon et al. |
| 8,420,442 | B2 | 4/2013 | Takechi et al. |
| 8,445,902 | B2 | 5/2013 | Sato et al. |
| 8,481,377 | B2 | 7/2013 | Akimoto et al. |
| 8,513,661 | B2 | 8/2013 | Takahashi et al. |
| 8,530,273 | B2 | 9/2013 | Den Boer |
| 8,558,323 | B2 | 10/2013 | Kim et al. |
| 8,618,537 | B2 | 12/2013 | Kaneko et al. |
| 8,624,240 | B2 | 1/2014 | Sato et al. |
| 8,642,402 | B2 | 2/2014 | Yano et al. |
| 8,889,480 | B2 | 11/2014 | Takechi et al. |
| 8,981,369 | B2 | 3/2015 | Yano et al. |
| 9,209,026 | B2 | 12/2015 | Takechi et al. |
| 9,240,488 | B2 | 1/2016 | Yamazaki et al. |
| 9,378,980 | B2 | 6/2016 | Yamazaki et al. |
| 2001/0046027 | A1 | 11/2001 | Tai et al. |
| 2002/0056838 | A1 | 5/2002 | Ogawa |
| 2002/0130374 | A1 | 9/2002 | Ueno et al. |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0039670 | A1 | 2/2005 | Hosono et al. |
| 2005/0173734 | A1 | 8/2005 | Yoshioka et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0205126 | A1 | 9/2006 | Yen |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0069209 | A1 | 3/2007 | Jeong et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0278490 | A1 | 12/2007 | Hirao et al. |

(56) References Cited

U.S. PATENT DOCUMENTS

| | | |
|---|---|---|
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0116500 A1 | 5/2008 | Tokunaga |
| 2008/0128689 A1 | 6/2008 | Lee et al. |
| 2008/0129195 A1 | 6/2008 | Ishizaki et al. |
| 2008/0136990 A1 | 6/2008 | Kimura |
| 2008/0138971 A1 | 6/2008 | Yamaguchi et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277656 A1 | 11/2008 | Park et al. |
| 2008/0296568 A1 | 12/2008 | Ryu et al. |
| 2008/0303020 A1 | 12/2008 | Shin et al. |
| 2008/0308806 A1 | 12/2008 | Akimoto et al. |
| 2009/0001881 A1 | 1/2009 | Nakayama |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236596 A1 | 9/2009 | Itai |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0038641 A1 | 2/2010 | Imai |
| 2010/0051936 A1 | 3/2010 | Hayashi et al. |
| 2010/0051940 A1 | 3/2010 | Yamazaki et al. |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0102314 A1 | 4/2010 | Miyairi et al. |
| 2010/0109002 A1 | 5/2010 | Itagaki et al. |
| 2010/0117073 A1 | 5/2010 | Yamazaki et al. |
| 2010/0117078 A1 | 5/2010 | Kuwabara et al. |
| 2010/0117999 A1 | 5/2010 | Matsunaga et al. |
| 2010/0140599 A1 | 6/2010 | Yano et al. |
| 2010/0144089 A1 | 6/2010 | Kaji et al. |
| 2010/0155716 A1 | 6/2010 | Cheong et al. |
| 2010/0159639 A1 | 6/2010 | Sakata |
| 2010/0176383 A1 | 7/2010 | Park et al. |
| 2010/0207119 A1 | 8/2010 | Sakata et al. |
| 2010/0224871 A1 | 9/2010 | Yamaguchi et al. |
| 2010/0264434 A1 | 10/2010 | Ploessl et al. |
| 2010/0267198 A1 | 10/2010 | Yabuta et al. |
| 2010/0295037 A1 | 11/2010 | Hironaka |
| 2010/0295042 A1 | 11/2010 | Yano et al. |
| 2010/0320471 A1 | 12/2010 | Takechi et al. |
| 2011/0001136 A1 | 1/2011 | Hasegawa et al. |
| 2011/0017990 A1 | 1/2011 | Son et al. |
| 2011/0017996 A1 | 1/2011 | Den et al. |
| 2011/0084262 A1 | 4/2011 | Kondratyuk et al. |
| 2011/0095288 A1 | 4/2011 | Morosawa et al. |
| 2011/0127523 A1* | 6/2011 | Yamazaki ......... H01L 21/02554 257/43 |
| 2011/0127579 A1* | 6/2011 | Yamazaki ......... H01L 21/02472 257/192 |
| 2011/0133180 A1* | 6/2011 | Yamazaki ......... H01L 21/3003 257/43 |
| 2011/0140100 A1 | 6/2011 | Takata et al. |
| 2011/0140108 A1* | 6/2011 | Kimura ............. H01L 29/786 257/57 |
| 2011/0147737 A1* | 6/2011 | Yamazaki ......... H01L 27/11517 257/43 |
| 2011/0163309 A1 | 7/2011 | Choi et al. |
| 2011/0175090 A1 | 7/2011 | Sugihara et al. |
| 2011/0182110 A1 | 7/2011 | Yamazaki et al. |
| 2011/0204362 A1 | 8/2011 | Akimoto et al. |
| 2011/0215328 A1 | 9/2011 | Morosawa et al. |
| 2011/0240989 A1 | 10/2011 | Sekine et al. |
| 2011/0256684 A1 | 10/2011 | Iwasaki et al. |
| 2011/0266542 A1 | 11/2011 | Ryu et al. |
| 2012/0001167 A1 | 1/2012 | Morosawa |
| 2012/0012835 A1 | 1/2012 | Herman et al. |
| 2012/0012847 A1* | 1/2012 | Koyama ............. G02F 1/13454 257/59 |
| 2012/0086040 A1 | 4/2012 | Lee et al. |
| 2012/0112251 A1 | 5/2012 | Forbes et al. |
| 2012/0161121 A1* | 6/2012 | Yamazaki ......... H01L 29/78621 257/43 |
| 2012/0161122 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2012/0162561 A1 | 6/2012 | Kimura |
| 2012/0175611 A1 | 7/2012 | Kirita et al. |
| 2012/0242627 A1 | 9/2012 | Kim et al. |
| 2012/0304918 A1 | 12/2012 | Ichinose et al. |
| 2013/0037793 A1 | 2/2013 | Pan et al. |
| 2013/0112971 A1 | 5/2013 | Yano et al. |
| 2013/0127694 A1 | 5/2013 | Kim et al. |
| 2013/0140557 A1 | 6/2013 | Miyairi et al. |
| 2013/0147519 A1 | 6/2013 | Koyama et al. |
| 2013/0244375 A1 | 9/2013 | Yamazaki et al. |
| 2013/0309808 A1 | 11/2013 | Zhang et al. |

FOREIGN PATENT DOCUMENTS

| | | |
|---|---|---|
| EP | 1737044 A | 12/2006 |
| EP | 2061087 A | 5/2009 |
| EP | 2110855 A | 10/2009 |
| EP | 2120267 A | 11/2009 |
| EP | 2175493 A | 4/2010 |
| EP | 2226847 A | 9/2010 |
| EP | 2408011 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-278768 A | 11/1989 |
| JP | 05-251705 A | 9/1993 |
| JP | 06-275697 A | 9/1994 |
| JP | 08-250737 A | 9/1996 |
| JP | 08-264794 A | 10/1996 |
| JP | 11-505377 | 5/1999 |
| JP | 11-233789 A | 8/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-268724 A | 9/2005 |
| JP | 2006-165531 A | 6/2006 |
| JP | 2007-096055 A | 4/2007 |
| JP | 2007-123861 A | 5/2007 |
| JP | 2007-220816 A | 8/2007 |
| JP | 2007-220818 A | 8/2007 |
| JP | 2007-250983 A | 9/2007 |
| JP | 2008-040343 A | 2/2008 |
| JP | 2008-042088 A | 2/2008 |
| JP | 2008-072025 A | 3/2008 |
| JP | 2008-112909 A | 5/2008 |

(56) References Cited

FOREIGN PATENT DOCUMENTS

| | | |
|---|---|---|
| JP | 2008-192721 A | 8/2008 |
| JP | 2008-199005 A | 8/2008 |
| JP | 2008-219008 A | 9/2008 |
| JP | 2008-243929 A | 10/2008 |
| JP | 2008-270744 A | 11/2008 |
| JP | 2008-277665 A | 11/2008 |
| JP | 2009-010362 A | 1/2009 |
| JP | 2009-141342 A | 6/2009 |
| JP | 2009-167087 A | 7/2009 |
| JP | 2009-528670 | 8/2009 |
| JP | 2009-267399 A | 11/2009 |
| JP | 2009-272427 A | 11/2009 |
| JP | 2009-278115 A | 11/2009 |
| JP | 2009-283793 A | 12/2009 |
| JP | 2010-062229 A | 3/2010 |
| JP | 2010-093070 A | 4/2010 |
| JP | 2010-135774 A | 6/2010 |
| JP | 2010-199307 A | 9/2010 |
| JP | 2010-272663 A | 12/2010 |
| TW | 588209 | 5/2004 |
| WO | WO-2004/114391 | 12/2004 |
| WO | WO-2007/119386 | 10/2007 |
| WO | WO-2007/142167 | 12/2007 |
| WO | WO-2008/096768 | 8/2008 |
| WO | WO-2008/099863 | 8/2008 |
| WO | WO-2008/149873 | 12/2008 |
| WO | WO-2009/075281 | 6/2009 |
| WO | WO-2009/093625 | 7/2009 |
| WO | WO-2009/136645 | 11/2009 |
| WO | WO-2010/001783 | 1/2010 |
| WO | WO-2011/074407 | 6/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5. pp. 2957-2959.

Kimizuka.N. et al., "SPINEL,YbFe2O4, and Yb2Fe3O7 Types of Structures for Compounds in the In2O3 and Sc2OS—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3. and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technglogy", SID Digest '09 : SID International Symposium Digest Of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature". Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155. No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
International Search Report (Application No. PCT/JP2010/071416) dated Jan. 18, 2011.
Written Opinion (Application No. PCT/JP2010/071416) dated Jan. 18, 2011.
Jiang.M et al., "Preparation and photoelectric properties of Ti doped ZnO thin films annealed in vacuum", J. Mater. Sci. Lett.(Journal of Materials Science Letters), Feb. 17, 2009, vol. 20, pp.1225-1228.
Quirk.M et al., "Lightly Doped Drain", Semiconductor Manufacturing Technology, 2001, Prentice-Hall, Inc.
Du.X et al., "Co Gas Sensing by Ultrathin Tin Oxide Films Grown by Atomic Layer Deposition Using Transmission FTIR Spectroscopy", J. Phys. Chem. A (Journal of Physical Chemistry A), 2008, vol. 112, No. 39, pp. 9211-9219.

(56) References Cited

OTHER PUBLICATIONS

Taiwanese Office Action (Application No. 099143055) dated Mar. 9, 2015.
Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.
Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 374-376.
Du Ahn.B et al., "Comparison of the effects of Ar and H2 plasmas on the performance of homojunctioned amorphous indium gallium zinc oxide thin film transistors", Appl. Phys. Lett. (Applied Physics Letters) , 2008, vol. 93, No. 20, pp. 203506-1-203506-3.
Kim.G et al., "Effect of indium composition ratio on solution-processed nanocrystalline InGaZnO thin film transistors", Appl. Phys. Lett. (Applied Physics Letters) , 2009, vol. 94, pp. 233501-1-233501-3, the American Institute of Physics.
Minami.T et al., "Highly Conductive and Transparent Silicon Doped Zinc Oxide Thin Films Prepared by RF Magnetron Sputtering", Jpn. J. Appl. Phys. (Japanese Journal of Applied Physics) , Sep. 20, 1986, vol. 25, No. 9, pp. L776-L779.

* cited by examiner

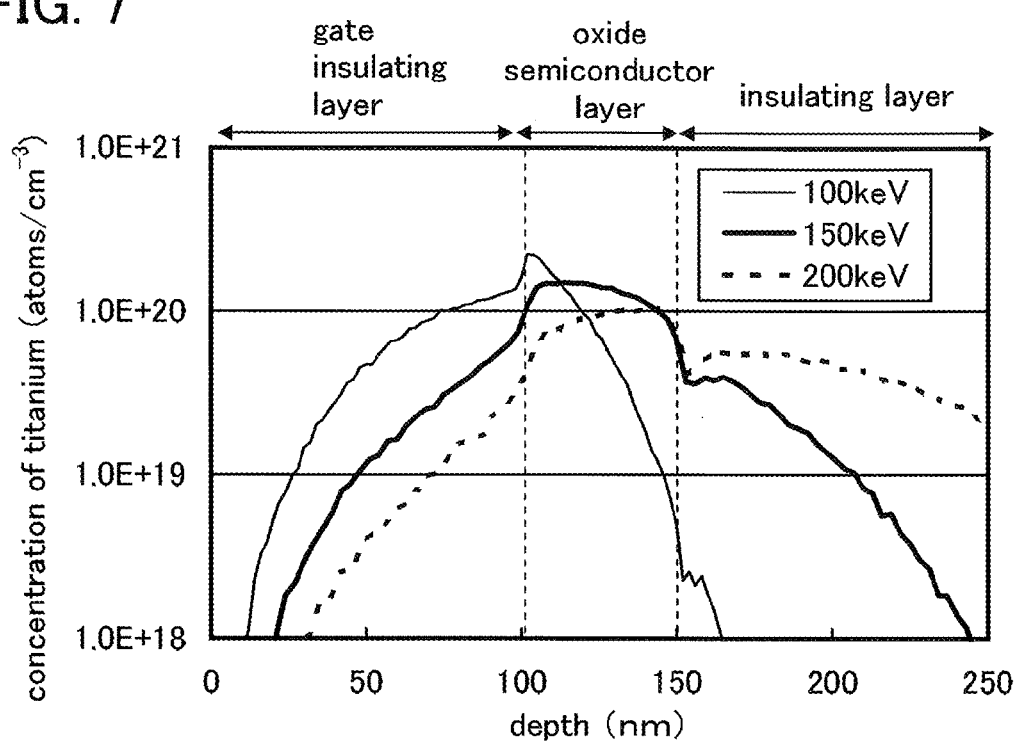

SEMICONDUCTOR DEVICE AND METHOD FOR MANUFACTURING THE SAME

TECHNICAL FIELD

The present invention relates to a semiconductor device including an oxide semiconductor and a method for manufacturing the semiconductor device.

In this specification, a "semiconductor device" refers to all devices which can function by utilizing semiconductor characteristics, and electro-optical devices, semiconductor circuits, and electronic devices are all included in the category of the semiconductor device.

BACKGROUND ART

A technique for manufacturing a thin film transistor (TFT) by using a thin semiconductor film formed over a substrate having an insulating surface has attracted attention. The technique is widely used for thin film transistors or electronic devices such as electro-optical devices. A silicon-based semiconductor material is known as a material for a thin semiconductor film which can be used in a thin film transistor. Other than the silicon-based semiconductor material, an oxide semiconductor has attracted attention.

Better electric characteristics of a transistor including an oxide semiconductor are required for application to semiconductor devices with higher performance. A technique has been reported in which in a transistor including an oxide semiconductor, for the purpose of uniformity and high-speed operation, hydrogen or deuterium contained in a source and drain electrodes is diffused into an oxide semiconductor layer, whereby the resistance of regions in contact with the source and drain electrodes in the oxide semiconductor layer is reduced (e.g., Patent Document 1).

REFERENCE

[Patent Document 1] Japanese Published Patent Application No. 2008-72025

DISCLOSURE OF INVENTION

When on-state characteristics of a transistor including an oxide semiconductor are improved, high-speed response and high-speed operation of a semiconductor device can be obtained; thus, a semiconductor device with higher performance can be achieved.

In view of the above, an object of one embodiment of the present invention is to provide a transistor including an oxide semiconductor, which has good on-state characteristics.

Further, an object of one embodiment of the present invention is to provide a high-performance semiconductor device including a transistor capable of high-speed response and high-speed operation.

In a transistor including an oxide semiconductor layer, factors which induce oxygen defects (hereinafter, oxygen-defect-inducing factors) are introduced (added) into the oxide semiconductor layer, whereby the resistance of a source region and a drain region is selectively reduced. The oxygen-defect-inducing factors are introduced into the oxide semiconductor layer, whereby oxygen defects which serve as donors can be effectively formed in the oxide semiconductor layer. Therefore, the oxygen-defect-inducing factors can also be considered as donor factors for an oxide semiconductor, and the resistance of the oxide semiconductor layer is reduced by the donor factors.

As the oxygen-defect-inducing factors to be introduced are preferably one or more elements selected from titanium (Ti), tungsten (W), molybdenum (Mo), aluminum (Al), cobalt (Co), zinc (Zn), indium (In), silicon (Si), and boron (B). Hydrogen or nitrogen can be added in addition to the above oxygen-defect-inducing factor. Note that it is more preferable to use a metal element with a high oxygen affinity as the oxygen-defect-inducing factors. In that case, it is preferable to use a single ion of the above oxygen-defect-inducing factor or a hydride ion, a fluoride ion, or a chloride ion.

In this specification, oxygen-defect-inducing factors are selectively introduced into a formed oxide semiconductor layer by an ion implantation method or a doping method. In addition, heat treatment may be performed after the oxygen-defect-inducing factors are introduced.

One embodiment of the invention disclosed in this specification is a semiconductor device which includes an oxide semiconductor layer including a channel formation region and a source and drain regions containing oxygen-defect-inducing factors over a substrate having an insulating surface; a gate insulating layer over the oxide semiconductor layer; a gate electrode layer overlapping with the channel formation region, over the gate insulating layer; an insulating layer covering the gate insulating layer, the oxide semiconductor layer, and the gate electrode layer; and a source electrode layer electrically connected to the source region and a drain electrode layer electrically connected to the drain region over the insulating layer.

One embodiment of the present invention disclosed in this specification is a semiconductor device which includes an oxide semiconductor layer including a channel formation region, a first region containing oxygen-defect-inducing factors, and a second region containing oxygen-defect-inducing factors over a substrate having an insulating surface; a gate insulating layer over the oxide semiconductor layer; a gate electrode layer overlapping with the channel formation region, over the gate insulating layer; an insulating layer covering the gate insulating layer, the oxide semiconductor layer, and the gate electrode layer; and a source electrode layer electrically connected to the source region and a drain electrode layer electrically connected to the drain region over the insulating layer. The first region is one of a source or drain region. The second region is provided between the channel formation region and the first region and has higher resistance than the first region.

One embodiment of the present invention disclosed in this specification is a method for manufacturing a semiconductor device. The method includes the steps of forming an oxide semiconductor layer over a substrate having an insulating surface; forming a gate insulating layer over the oxide semiconductor layer; forming a gate electrode layer over the gate insulating layer; forming a channel formation region, a source region, and a drain region in the oxide semiconductor layer by performing introducing treatment of oxygen-defect-inducing factors on the oxide semiconductor layer for selectively forming oxygen defects; forming an insulating layer covering the gate insulating layer, the oxide semiconductor layer, and the gate electrode layer; and forming a source electrode layer electrically connected to the source region and a drain electrode layer electrically connected to the drain region.

One embodiment of the present invention disclosed in this specification is a method for manufacturing a semiconductor device. The method includes the steps of forming an oxide semiconductor layer over a substrate having an insulating surface; forming a gate insulating layer over the oxide semiconductor layer; forming a gate electrode layer over the gate insulating layer; forming an insulating layer covering the gate insulating layer, the oxide semiconductor layer, and the gate electrode layer; forming a first region functioning as a source and drain regions, a second region having higher resistance than the first region, and a channel formation region by performing introducing treatment of oxygen-defect-inducing factors on the oxide semiconductor layer for selectively forming oxygen defects; and forming a source electrode layer electrically connected to the source region and a drain electrode layer electrically connected to the drain region.

Note that the ordinal numbers such as "first" and "second" in this specification are used for convenience and do not denote the order of steps and the stacking order of layers. In addition, the ordinal numbers in this specification do not denote particular names which specify the present invention.

Oxygen-defect-inducing factors are introduced into the oxide semiconductor layer, whereby oxygen defects which serve as donors can be effectively formed in the oxide semiconductor layer.

In a transistor including an oxide semiconductor layer in which the resistance of a source region and a drain region is reduced by introducing oxygen-defect-inducing factors, contact resistance between the oxide semiconductor layer and an electrode layer can be reduced; thus, on-state characteristics can be improved. Thus, a transistor with good electric characteristics can be obtained.

A transistor with good electric characteristics is capable of high-speed response and high-speed operation. Thus, a semiconductor device including the transistor can have high performance.

BRIEF DESCRIPTION OF DRAWINGS

FIG. 7 shows the relation between the depth at which oxygen-defect-inducing factors are introduced and the concentration of the oxygen-defect-inducing factors obtained by calculation.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that modes and details disclosed herein can be modified in various ways without departing from the spirit and scope of the present invention. Therefore, the present invention is not construed as being limited to description of the embodiments.

(Embodiment 1)

In this embodiment, one embodiment of a semiconductor device and a method for manufacturing the semiconductor device will be described with reference to FIGS. 1A to 1D. In this embodiment, a transistor will be described as an example of the semiconductor device.

FIGS. 1A to 1D illustrate an example of a transistor and a method for manufacturing the transistor.

Figure 1A:
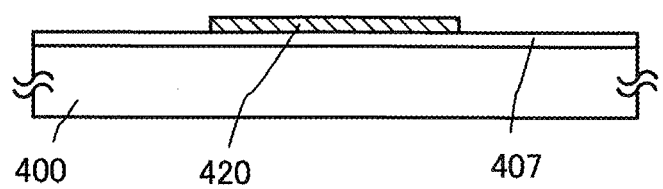
FIGS. 1A to 1D illustrate one embodiment of a semiconductor device and a method for manufacturing the semiconductor device.
Figure 1B:
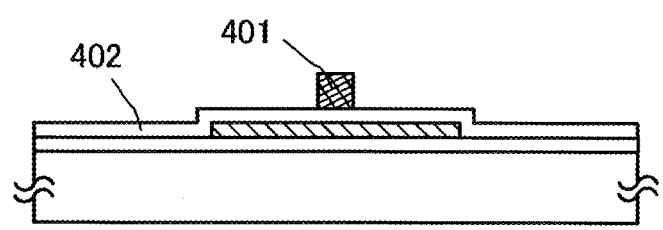
Figure 1C:
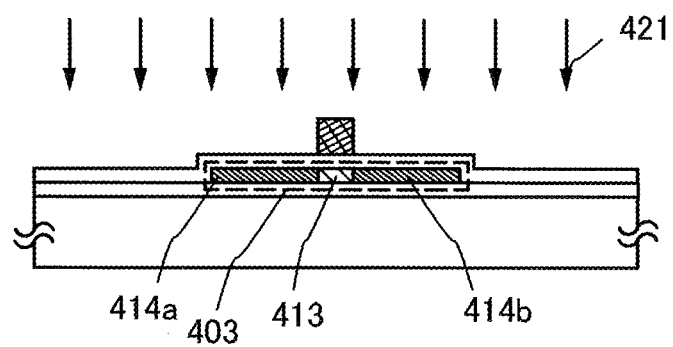
Figure 1D:
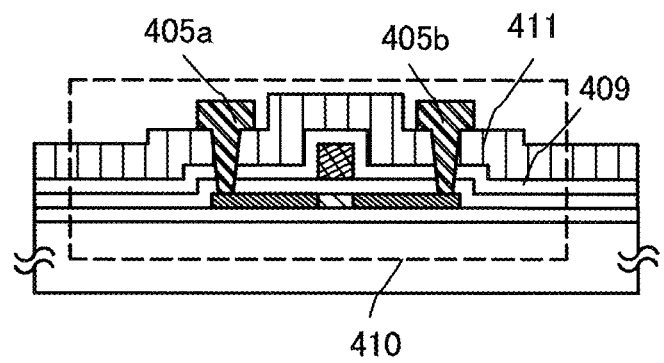

A transistor 410 illustrated in FIG. 1D is a top-gate thin film transistor and is also called a planar thin film transistor.

The transistor 410 includes, over a substrate 400 having an insulating surface, an insulating layer 407; an oxide semiconductor layer 403 including a channel formation region 413, a source region 414a containing oxygen-defect-inducing factors, and a drain region 414b containing oxygen-defect-inducing factors; a gate insulating layer 402; and a gate electrode layer 401.

An insulating layer 409 and an insulating layer 411 are stacked to cover the oxide semiconductor layer 403, the gate insulating layer 402, and the gate electrode layer 401. A source electrode layer 405a and a drain electrode layer 405b are provided to be electrically connected to the source region 414a and the drain region 414b, respectively, with the insulating layer 409 and the insulating layer 411 interposed therebetween.

The source region 414a and the drain region 414b are low-resistance regions in which donors are formed by introducing oxygen-defect-inducing factors.

A process of manufacturing the transistor 410 over the substrate 400 will be described below with reference to FIGS. 1A to 1D.

Although there is no particular limitation on a substrate which can be used as the substrate 400 having an insulating surface, the substrate needs to have at least heat resistance high enough to withstand heat treatment performed later.

For example, in the case where a glass substrate is used as the substrate and the temperature of heat treatment performed later is high, a glass substrate whose strain point is higher than or equal to 730° C. is preferably used. As a material for the glass substrate, for example, a glass material such as aluminosilicate glass, aluminoborosilicate glass, or barium borosilicate glass is used. Note that a glass substrate containing a larger amount of boron oxide ($B_2O_3$) than barium oxide (BaO), which is a practical heat-resistant glass substrate, may be used.

Note that instead of the above glass substrate, a substrate formed of an insulator, such as a ceramic substrate, a quartz substrate, or a sapphire substrate may be used. Alternatively, crystallized glass or the like can be used. Further alternatively, a plastic substrate or the like can be used as appropriate.

The insulating layer 407 which serves as a base film is formed over the substrate 400. The insulating layer 407 has a function of preventing diffusion of impurity elements from the substrate 400. The insulating layer 407 can be formed to have a single-layer structure or a stacked-layer structure using one or more of a silicon nitride layer, a silicon oxide layer, a silicon nitride oxide layer, a silicon oxynitride layer, an aluminum nitride layer, an aluminum oxide layer, an aluminum nitride oxide layer, and/or an aluminum oxynitride layer. The insulating layer 407 can be formed by a plasma CVD method, a sputtering method, or the like. As the insulating layer 407, for example, a silicon oxide layer can be formed by a sputtering method.

An oxide semiconductor film is formed over the insulating layer 407.

As an oxide semiconductor used for the oxide semiconductor film, the following can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor. Here, for example, the In—Ga—Zn—O-based oxide semiconductor means an oxide containing at least In, Ga, and Zn, and the composition ratio of the elements is not particularly limited. The In—Ga—Zn—O-based oxide semiconductor may contain an element other than In, Ga, and Zn. The above oxide semiconductor film may contain $SiO_2$.

For the oxide semiconductor film, an oxide semiconductor represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

The oxide semiconductor film can be formed by a sputtering method. In this embodiment, an oxide semiconductor film is formed using an In—Ga—Zn—O-based oxide target by a sputtering method, and the oxide semiconductor film is processed into the island-shaped oxide semiconductor layer 420 (see FIG. 1A).

The gate insulating layer 402 is formed over the oxide semiconductor layer 420. The gate insulating layer 402 can be formed to have a single-layer structure or a stacked-layer structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer by a plasma CVD method, a sputtering method, or the like. For example, as the gate insulating layer 402, a silicon oxide layer with a thickness of 100 nm may be formed by a sputtering method.

Alternatively, the gate insulating layer 402 may have a structure in which a silicon oxide layer and a silicon nitride layer are stacked in this order over the oxide semiconductor layer 420. For example, a silicon oxide layer ($SiO_x$ (x>0)) with a thickness of greater than or equal to 5 nm and less than or equal to 300 nm may be formed as a first gate insulating layer by a sputtering method, and then a silicon nitride layer ($SiN_y$ (y>0)) with a thickness of greater than or equal to 50 nm and less than or equal to 200 nm may be stacked as a second gate insulating layer over the first gate insulating layer. The thickness of the gate insulating layer 402 may be set as appropriate depending on characteristics needed for a thin film transistor, and may be approximately 30 nm to 400 nm.

The gate electrode layer 401 is formed over the gate insulating layer 402 (see FIG. 1B). The gate electrode layer 401 can be formed to have a single-layer or stacked-layer structure using a metal material such as molybdenum, titanium, chromium, tantalum, tungsten, aluminum, copper, neodymium, or scandium, or an alloy material containing any of these materials as a main component.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of a material for the light-transmitting conductive film, a light-transmitting conductive oxide or the like can be given.

Next, oxygen-defect-inducing factors 421 are introduced into the oxide semiconductor layer 420, so that the oxide semiconductor layer 403 including the source region 414a, the drain region 414b, and the channel formation region 413 is formed (see FIG. 1C). The concentration of the oxygen-defect-inducing factors 421 in each of the source region 414a and the drain region 414b is preferably, for example, greater than or equal to $1\times10^{19}$ atoms/cm$^3$ and less than or equal to $1\times10^{21}$ atoms/cm$^3$.

Heat treatment (for example, at a temperature higher than or equal to 200° C. and lower than or equal to 600° C.) may be performed after the introducing treatment of the oxygen-defect-inducing factors 421.

In this specification, the concentration of oxygen-defect-inducing factors refers to the concentration of oxygen-defect-inducing factors which are introduced through the introducing treatment after formation of the oxide semiconductor layer, and elements which are contained during steps other than the introducing treatment and are the same as the oxygen-defect-inducing factors are excluded.

As the oxygen-defect-inducing factors 421, one or more elements selected from titanium (Ti), tungsten (W), molybdenum (Mo), aluminum (Al), cobalt (Co), zinc (Zn), indium (In), silicon (Si), and boron (B) can be used. In addition to the above oxygen-defect-inducing factors, hydrogen and/or nitrogen may be used.

The oxygen-defect-inducing factors 421 are selectively introduced into the oxide semiconductor layer 420, whereby oxygen defects are effectively induced in the region into which the oxygen-defect-inducing factors 421 are introduced. The oxygen defects serve as donors; thus, the oxide semiconductor layer 403 including the source region 414a and the drain region 414b the resistance of which is selectively reduced can be formed.

In this embodiment, the gate electrode layer 401 is used as a mask in the introducing treatment of the oxygen-defect-inducing factors 421. Thus, the oxygen-defect-inducing factors 421 are not introduced into a region in the oxide semiconductor layer 403, which overlaps with the gate electrode layer 401, in a self-aligned manner and the region becomes the channel formation region 413; in contrast, the oxygen-defect-inducing factors 421 are introduced into a region which does not overlap with the gate electrode layer 401, so that the source region 414a and the drain region 414b are formed. A mask for covering at least the channel formation region in the oxide semiconductor layer 420 may be additionally provided for the introducing treatment of the oxygen-defect-inducing factors 421. As the mask, a resist mask formed through a photolithography step may be used.

An effect of reducing the resistance by forming oxygen defects in an oxide semiconductor layer was examined on the basis of computational results. The calculation was performed on the case where an In—Ga—Zn—O-based oxide semiconductor material was used for the oxide semiconductor layer. Note that in the calculation, the composition ratio of In to Ga, Zn, and O of the In—Ga—Zn—O-based oxide semiconductor material was 1:1:1:4.

An amorphous structure of an In—Ga—Zn—O-based oxide semiconductor was prepared by a melt-quench method using classical molecular dynamics (MD) simulation. Here, the calculation was performed on the structure whose the total number of atoms was 84 and the density was 5.9 g/cm$^3$. Born-Mayer-Huggins potential was used for the interatomic potential between metal and oxygen and between oxygen and oxygen, and Lennard-Jones potential was used for the interatomic potential between metal and metal. NTV ensemble was used for the calculation. Materials Explorer was used as a calculation program.

After that, the structure obtained by the above classical MD simulation was optimized by first-principles calculation (quantum MD calculation) using a plane wave-pseudopotential method based on density functional theory (DFT), and the density of states was calculated. In addition, structure optimization was also performed on a structure in which one of oxygen atoms was removed randomly, and the density of states was calculated. CASTEP was used as a calculation program, and GGA-PBE was used as an exchange-correlation functional.

Figure 8A:
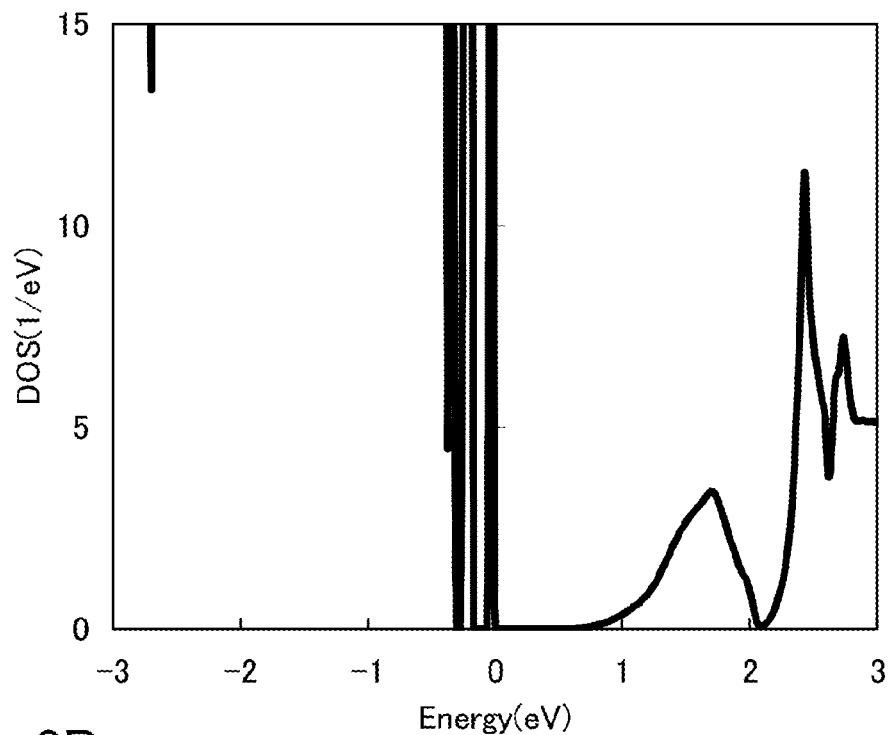
FIGS. 8A and 8B each show density of states obtained by calculation.
Figure 8B:
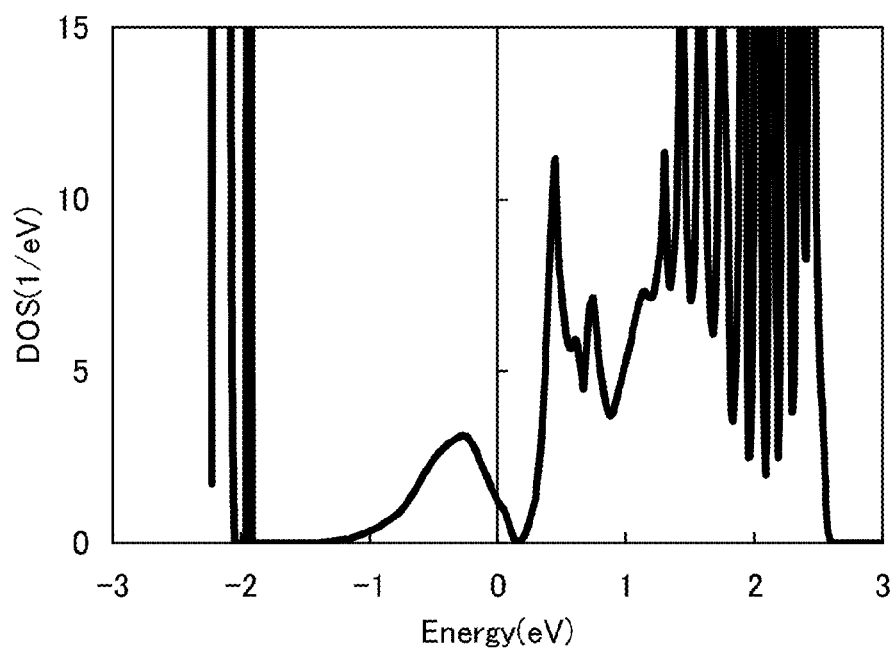

FIGS. 8A and 8B each show the density of states of the structure obtained by the above calculation. FIG. 8A shows the density of states of the structure without oxygen defects, and FIG. 8B shows the density of states of the structure with oxygen defects. Here, 0 (eV) represents energy corresponding to the Fermi level. According to FIGS. 8A and 8B, the Fermi level exists at the upper end of the valence band in the structure without oxygen defects, whereas the Fermi level exists in the conduction band in the structure with oxygen defects. In the structure with oxygen defects, the Fermi level exists in the conduction band; thus, the number of electrons contributing to conduction is increased, so that a structure having low resistance (i.e., high conductivity) can be obtained.

As described above, oxygen-defect-inducing factors are selectively introduced into an oxide semiconductor layer to effectively induce oxygen defects, whereby a source region and a drain region the resistance of which is reduced can be formed in the oxide semiconductor layer.

Note that it is more preferable to use a metal element with a high oxygen affinity as the oxygen-defect-inducing factors 421. As examples of the metal element with a high oxygen affinity, titanium, aluminum, manganese, magnesium, zirconium, beryllium, and the like are given. Alternatively, copper or the like may be used.

Next, an effect of using a metal element with a high oxygen affinity as the oxygen-defect-inducing factors will be described on the basis of computational results. This time, calculation was performed on the case where titanium was used as a metal element with a high oxygen affinity and an In—Ga—Zn—O-based oxide semiconductor material was used for an oxide semiconductor layer; however, one embodiment of the disclosed invention in not limited thereto. Note that in the calculation, the composition ratio of In to Ga, Zn, and O of the In—Ga—Zn—O-based oxide semiconductor material was 1:1:1:4.

By introducing the metal element with a high oxygen affinity, movement of oxygen from an amorphous oxide semiconductor to the metal element with a high oxygen affinity was observed.

Next, the electron state of a structure in which titanium (Ti) was contained in the In—Ga—Zn—O-based oxide semiconductor was calculated. A calculation model and calculation conditions are described below.

Figure 9:
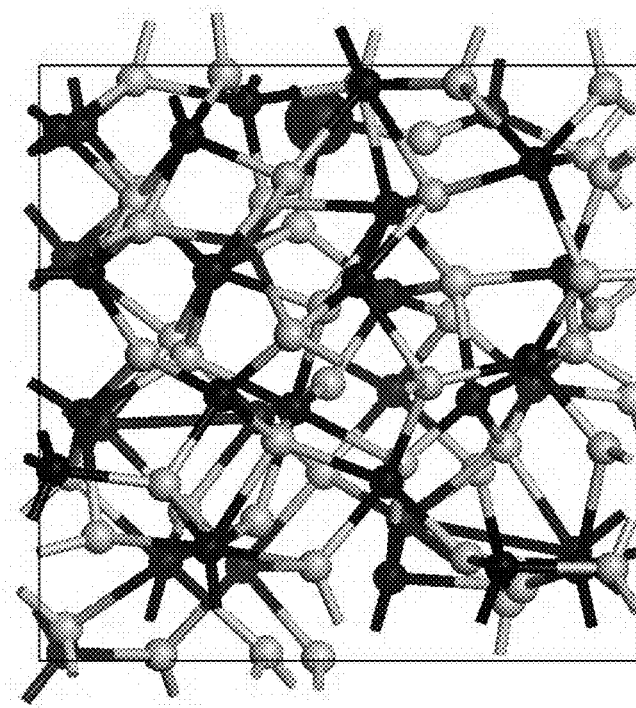
FIG. 9 shows a structure used for calculation.

FIG. 9 shows the structure of the In—Ga—Zn—O-based oxide semiconductor containing Ti, which was used for the calculation. This structure is a structure which is manufactured by first-principles molecular dynamics simulation and in which Ti is contained in the In—Ga—Zn—O-based oxide semiconductor that is a stoichiometric composition. Black circles represent metal atoms and white circles represent oxygen atoms. A large black circle represents Ti. In the structure of the In—Ga—Zn—O-based oxide semiconductor containing Ti shown in FIG. 9, the numbers of In, Ga, and Zn are 12, 48, and 1, respectively.

The density of the In—Ga—Zn—O-based oxide semiconductor structure containing Ti was fixed at 5.9 g/cm$^3$ which was an experimental value of an amorphous In—Ga—Zn—O-based oxide semiconductor. The calculation was performed on the structure under the calculation conditions described below. CASTEP, first-principles calculation software produced by Accelrys Software Inc., was used for the first-principles calculation.

The calculation was performed on the In—Ga—Zn—O-based oxide semiconductor structure containing Ti shown in FIG. 9 while the temperature was decreased from 3000 K to 1500 K, and then to 300 K under conditions that the number of particles (N), the volume (V), and the temperature (T) were fixed (NVT ensemble), the time step was 1 fsec, the number of steps at each temperature was 2000, the electron cut-off energy was 260 eV, and the k-point sets was 1×1×1. After that, the resulting structure was optimized by calculation under conditions that the electron cut-off energy was 420 eV and the k-point sets was 2×2×2, whereby the structure had low energy and was stabilized.

As shown in FIG. 9, titanium is combined with oxygen.

The electron density of states in the In—Ga—Zn—O-based oxide semiconductor structure containing Ti shown in FIG. 9 was calculated under conditions that the electron cut-off energy was 420 eV and the k-point sets was 3×3×3.

Figure 10A:
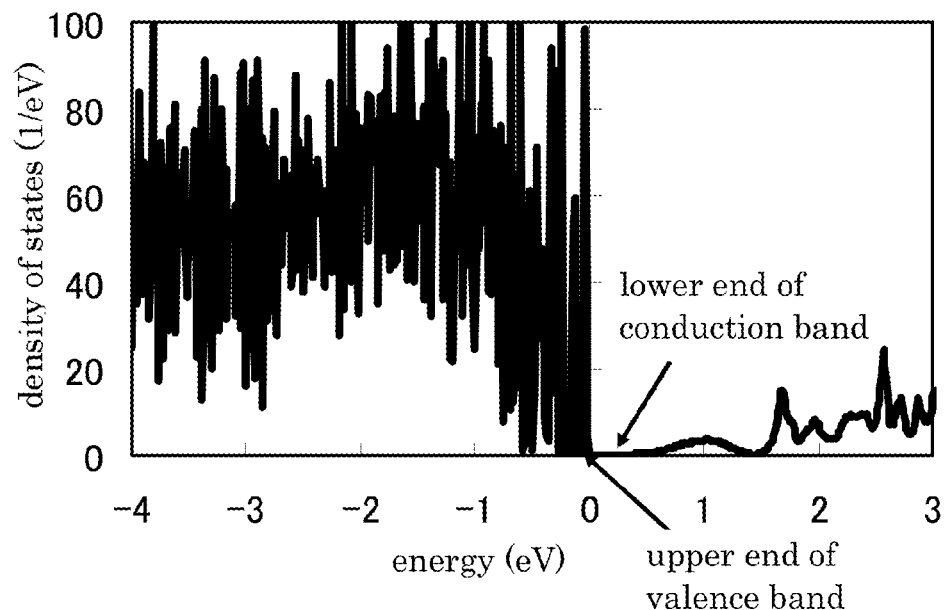
FIGS. 10A and 10B each show density of states of atoms obtained by calculation.
Figure 10B:
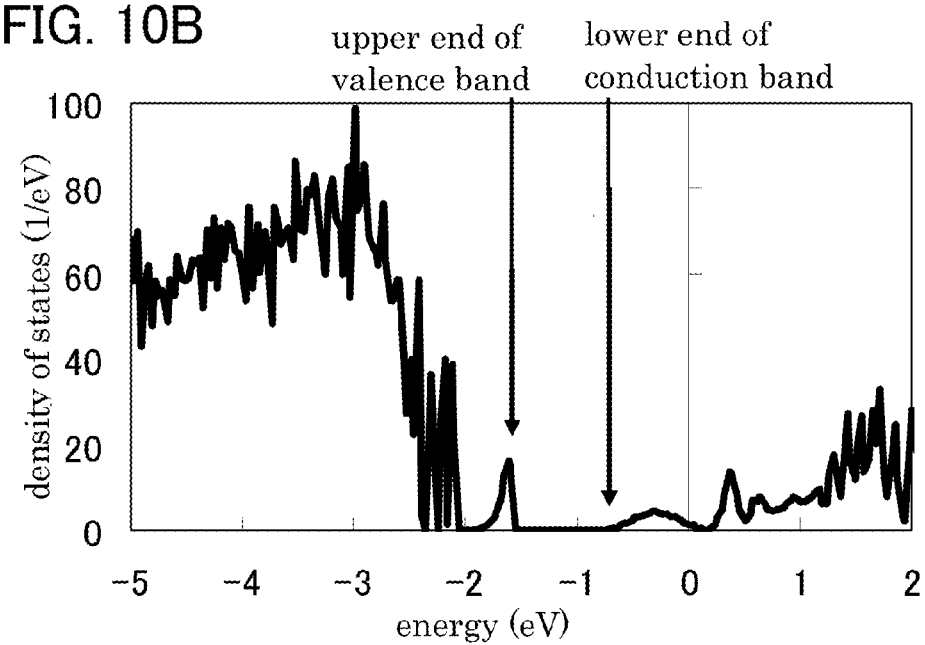

FIG. 10A shows the density of states in the whole In—Ga—Zn—O-based oxide semiconductor structure. FIG. 10B shows the density of states in part of the In—Ga—Zn—O-based oxide semiconductor structure containing Ti. In FIGS. 10A and 10B, the horizontal axis represents energy and the vertical axis represents density of states. The origin of the energy in the horizontal axis represents the energy of the highest occupied level of electrons. As shown in FIG. 10B, electrons enter the lower end of the conduction band when Ti is contained in the In—Ga—Zn—O-based oxide semiconductor.

The above results show that when Ti is introduced into an In—Ga—Zn—O-based oxide semiconductor, Ti is combined with oxygen, so that deviation from the stoichiometric ratio occurs. Accordingly, an oxygen-deficient state is caused. In an amorphous In—Ga—Zn—O-based oxide semiconductor, oxygen defects serve as electron donors, which results in an electron-excess state. Thus, when Ti which is easily combined with oxygen is introduced, oxygen defects are caused, which results in generation of carriers.

As described above, it can be observed that when metal elements with a high oxygen affinity are introduced into an oxide semiconductor layer, oxygen atoms move to the metal elements from the oxide semiconductor layer, which results in an effective increase in oxygen defects. As a result, the resistance of a region into which the metal elements have been introduced is effectively reduced by the increase in oxygen defects which serve as donors.

When a transistor including an oxide semiconductor includes a source region and a drain region whose resistance are reduced by introduction of oxygen-defect-inducing factors, contact resistance between an oxide semiconductor layer and an electrode layer can be reduced; thus, on-state characteristics (e.g., on-state current or field-effect mobility) are improved. Thus, a transistor with good electric characteristics can be obtained.

The oxygen-defect-inducing factors 421 are introduced into the formed oxide semiconductor layer 420 by selectively using an ion implantation method or a doping method. In this embodiment, titanium is used as the oxygen-defect-inducing factors 421 and is introduced into the oxide semiconductor layer 420 by an ion implantation method. As examples of the ion implantation method, a method using a titanium tetrachloride ($TiCl_4$) liquefied gas, a method of vaporizing a solid source, and the like are given.

Note that, in some cases, oxygen-defect-inducing factors are contained even in a region of an oxide semiconductor layer, which overlaps with a mask (the gate electrode layer 401 in this embodiment), depending on the introducing conditions (e.g., acceleration energy and injection amount or dose of oxygen-defect-inducing factors). Thus, the region into which oxygen-defect-inducing factors are introduced can be controlled by setting introducing conditions and the thickness and size of a mask as appropriate.

For example, calculation was performed on introducing conditions in introducing treatment of oxygen-defect-inducing factors into an oxide semiconductor layer by using software called TRIM (transport of ion in matter). TRIM is software for calculation of ion introducing process by a Monte Carlo method. A model used for the calculation was a stack of a silicon oxide film as the insulating layer 407, an amorphous In—Ga—Zn—O film (composition: $InGaZnO_4$, density: 6.2 $g/cm^3$, thickness: 50 nm) as the oxide semiconductor layer 420, and a silicon oxide film (density: 2.2 $g/cm^3$, thickness: 100 nm) as the gate insulating layer 402. The oxygen-defect-inducing factors 421 were introduced into the oxide semiconductor layer 420 after being made to pass through the gate insulating layer 402. Titanium ions ($Ti^+$) were used as the oxygen-defect-inducing factors 421 and were introduced at a dose of $1\times10^{15}$ $cm^{-2}$ by an ion implantation method. In addition, the acceleration energy in the calculation were 100 keV, 150 keV, and 200 keV.

FIG. 7 shows the relation between the depth at which oxygen-defect-inducing factors were introduced and the concentration obtained by calculation. In FIG. 7, the horizontal axis represents the depth (nm) from a surface of the oxide semiconductor layer 420, at which oxygen-defect-inducing factors were introduced and the vertical axis represents the concentration of introduced oxygen-defect-inducing factors ($atoms/cm^3$). As shown in FIG. 7, it was observed that titanium ions which were oxygen-defect-inducing factors were introduced into the oxide semiconductor layer 420 at a concentration of about $1\times10^{20}$ $atoms/cm^3$ under three conditions of acceleration energy of 100 keV, 150 keV, and 200 keV.

Thus, the introducing conditions of titanium ions for forming, in an oxide semiconductor layer, a source region and a drain region containing the titanium ions at a concentration of greater than or equal to $1\times10^{19}$ $atoms/cm^3$ and less than or equal to $1\times10^{21}$ $atoms/cm^3$ are a dose of greater than or equal to $1\times10^{14}$ $cm^{-2}$ and less than or equal to $1\times10^{16}$ $cm^{-2}$ and an acceleration energy of greater than or equal to 100 keV and less than or equal to 200 keV.

Oxygen-defect-inducing factors may also be introduced into the channel formation region 413 in the oxide semiconductor layer 403. In that case, introducing treatment of oxygen-defect-inducing factors is performed on the oxide semiconductor layer 420 before the gate electrode layer 401 is formed. The introducing treatment of oxygen-defect-inducing factors may be performed before the oxide semiconductor film is processed into the island-shaped oxide semiconductor layer. Oxygen-defect-inducing factors are also introduced into the channel formation region 413 to reduce the resistance (for example, the channel formation region is made to have $n^-$ type conductivity) using oxygen defects as donors, whereby electric characteristics of the transistor can be controlled.

Heat treatment (for example, at a temperature higher than or equal to 200° C. and lower than or equal to 600° C.) may be performed after the introducing treatment of oxygen-defect-inducing factors.

The concentration of oxygen-defect-inducing factors in the channel formation region 413 is lower than that in each of the source region 414a and the drain region 414b. As in this embodiment, in the case where the concentration of oxygen-defect-inducing factors in each of the source region 414a and the drain region 414b is greater than or equal to $1\times10^{19}$ $atoms/cm^3$ and less than or equal to $1\times10^{21}$ $atoms/cm^3$, the concentration of oxygen-defect-inducing factors in the channel formation region 413 may be, for example, less than $1\times10^{14}$ $atoms/cm^3$.

Next, the insulating layer 409 and the insulating layer 411 for covering the oxide semiconductor layer 403, the gate insulating layer 402, and the gate electrode layer 401 are stacked.

As the insulating layer 409 and the insulating layer 411, an inorganic insulating film such as an oxide insulating layer or a nitride insulating layer can be preferably used. As a formation method of the insulating layer 409 and the insulating layer 411, a plasma CVD method, a sputtering method, or the like may be used.

The insulating layer 409 can be formed using an inorganic insulating film typified by a silicon oxide film, a silicon oxynitride film, an aluminum oxide film, or an aluminum oxynitride film.

The insulating layer 411 can be formed using an inorganic insulating film such as a silicon nitride film, an aluminum nitride film, a silicon nitride oxide film, or an aluminum nitride oxide film.

A planarization insulating film may be formed over the insulating layer 411 in order to reduce surface roughness caused by a transistor. The planarization insulating film can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed using these materials. There is no particular limitation on the method for forming the planarization insulating film. The planarization insulating film can be formed, depending on the material, by a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater.

Openings (contact holes) which reach the source region 414a and the drain region 414b are formed in the insulating layer 409 and the insulating layer 411. A conductive film is formed in the openings and the conductive film is processed by etching, so that the source electrode layer 405a and the drain electrode layer 405b which are in contact with and electrically connected to the source region 414a and the drain region 414b, respectively are formed (see FIG. 1D). Through the above-described steps, the transistor 410 can be manufactured.

As the conductive film used for the source electrode layer 405a and the drain electrode layer 405b, for example, a film of an element selected from Al, Cr, Cu, Ta, Ti, Mo, and W, a film of an alloy containing any of these elements as a component, an alloy film containing these elements in combination, or the like can be used. The conductive film may have a structure in which a high-melting-point metal layer of Cr, Ta, Ti, Mo, W, or the like is stacked over and/or below a metal layer of Al, Cu, or the like. When an Al material to which an element which prevents generation of hillocks and whiskers in an Al film, such as Si, Ti, Ta, W, Mo, Cr, Nd, Sc, or Y, is added is used, heat resistance can be increased. Alternatively, a conductive nitride material of the above metal, such as titanium nitride may be used. As a formation method of the conductive film, an evaporation method, a sputtering method, or the like can be used.

The source electrode layer 405a and the drain electrode layer 405b may have a single-layer structure or a stacked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given.

Alternatively, the conductive film which serves as the source electrode layer 405a and the drain electrode layer 405b (including a wiring formed using the same layer as the source electrode layer 405a and the drain electrode layer 405b) may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

As described above, in the transistor 410 which includes an oxide semiconductor including the source region 414a and the drain region 414b the resistance of which is reduced by introducing the oxygen-defect-inducing factors, contact resistance between the oxide semiconductor layer 403 and the source electrode layer 405a and between the oxide semiconductor layer 403 and the drain electrode layer 405b can be reduced; thus, on-state characteristics are improved. Thus, the transistor can have good electric characteristics.

The transistor with good electric characteristics is capable of high-speed response and high-speed operation. Thus, the semiconductor device including the transistor can have high performance.

(Embodiment 2)

In this embodiment, one embodiment of a semiconductor device and a method for manufacturing the semiconductor device will be described with reference to FIGS. 2A to 2D and FIGS. 3A to 3D. In this embodiment, a transistor will be described as an example of the semiconductor device. A structure in which regions containing oxygen-defect-inducing factors at lower concentration than a source and drain regions are provided between a channel formation region and the source and drain regions in the transistor described in Embodiment 1 will be described. Therefore, the same portions as in the above embodiment and portions having functions similar to those of the portions in the above embodiment can be formed in a manner similar to that of the above embodiment and steps similar to those in the above embodiment can be performed in a manner similar to that of the above embodiment, and the description thereof is not repeated. In addition, detailed description of the same portions is not given.

An example of a transistor and examples of methods for manufacturing the transistor will be described with reference to FIGS. 2A to 2D and FIGS. 3A to 3D.

Figure 2A:
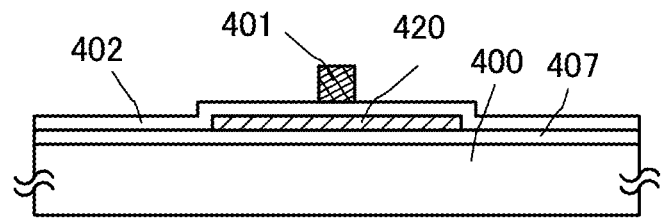
FIGS. 2A to 2D illustrate one embodiment of a semiconductor device and a method for manufacturing the semiconductor device.
Figure 2B:
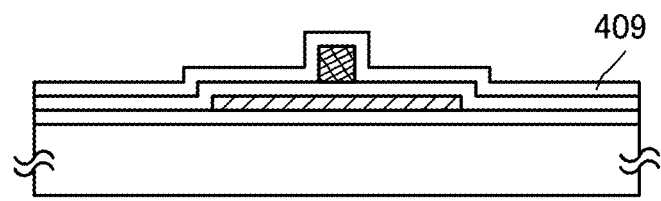
Figure 2C:
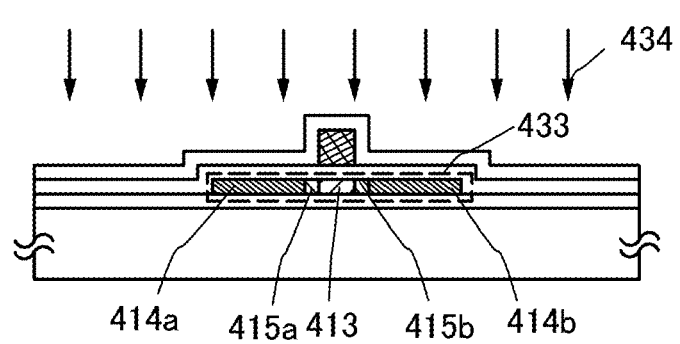
Figure 2D:
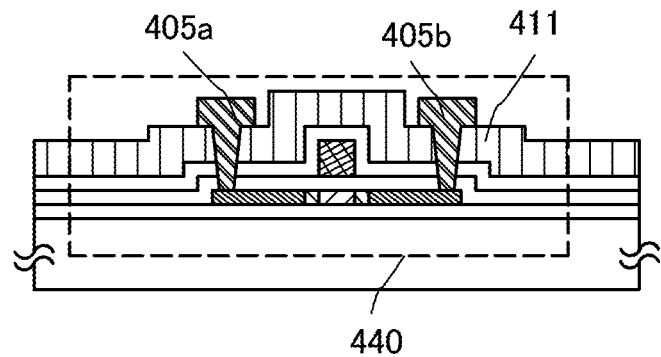

A transistor illustrated 440 in FIG. 2D is a top-gate thin film transistor and is also called a planar thin film transistor.

The transistor 440 includes, over the substrate 400 having an insulating surface, an insulating layer 407; an oxide semiconductor layer 433 in which a channel formation region 413, regions 415a and 415b which contain oxygen-defect-inducing factors at low concentration (hereinafter, low-concentration-oxygen-defect-inducing-factor-containing regions 415a and 415b), a source region 414a containing oxygen-defect-inducing factors, and a drain region 414b containing oxygen-defect-inducing factors are provided, a gate insulating layer 402; and a gate electrode layer 401.

An insulating layer 409 and an insulating layer 411 are stacked to cover the oxide semiconductor layer 433, the gate insulating layer 402, and the gate electrode layer 401. A source electrode layer 405a and a drain electrode layer 405b are provided to be electrically connected to the source region 414a and the drain region 414b, respectively, with the insulating layer 409 and the insulating layer 411 interposed therebetween.

The low-concentration-oxygen-defect-inducing-factor-containing regions 415a and 415b, the source region 414a, and the drain region 414b are regions which contains oxygen-defect-inducing factors. The source region 414a and the drain region 414b which contain oxygen-defect-inducing factors at higher concentration than the low-concentration-oxygen-defect-inducing-factor-containing regions 415a and 415b can also be referred to as high-concentration-oxygen-defect-inducing-factor-containing regions. Therefore, in this specification, the source region 414a and the drain region 414b which are high-concentration-oxygen-defect-inducing-factor-containing regions are also referred to as first regions while the low-concentration-oxygen-defect-inducing-factor-containing regions 415a and 415b are also referred to as second regions.

The low-concentration-oxygen-defect-inducing-factor-containing regions 415a and 415b, the source region 414a, and the drain region 414b are low-resistance regions in which donors are formed by oxygen-defect-inducing factors. The low-concentration-oxygen-defect-inducing-factor-containing regions 415a and 415b contain oxygen-defect-inducing factors at lower concentration than the source region 414a and the drain region 414b which are high-concentration-oxygen-defect-inducing-factor-containing regions, and thus have lower resistance than the source region and the drain region.

Therefore, in the oxide semiconductor layer 433 of the transistor 440, the resistance is lower in order of the channel formation region 413, the low-concentration-oxygen-defect-inducing-factor-containing regions 415a and 415b, and the source and drain regions 414a and 414b.

A process of manufacturing the transistor 440 over the substrate 400 will be described below with reference to FIGS. 2A to 2D.

As illustrated in FIG. 1B used in Embodiment 1, an island-shaped oxide semiconductor layer 420, the gate insulating layer 402, and the gate electrode layer 401 are formed over the substrate 400 provided with the insulating layer 407 (see FIG. 2A).

Introducing treatment of oxygen-defect-inducing factors may also be performed on a region which corresponds to the channel formation region in the oxide semiconductor layer 420 (a region which overlaps with the gate electrode layer 401) so that oxygen-defect-inducing factors are contained in the region. In that case, introducing treatment of oxygen-defect-inducing factors is performed on the oxide semiconductor layer 420 before the gate electrode layer 401 is formed. The introducing treatment of oxygen-defect-inducing factors may be performed before the oxide semiconductor film is processed into the island-shaped oxide semiconductor layer. Oxygen-defect-inducing factors are also introduced into the channel formation region to reduce the resistance (for example, the channel formation region is made to have n⁻ type conductivity) using oxygen defects as donors, whereby electric characteristics of the transistor can be controlled.

Heat treatment (for example, at a temperature higher than or equal to 200° C. and lower than or equal to 600° C.) may be performed after the introducing treatment of oxygen-defect-inducing factors.

Next, the insulating layer 409 for covering the oxide semiconductor layer 420, the gate insulating layer 402, and the gate electrode layer 401 are formed (see FIG. 2B).

Next, oxygen-defect-inducing factors 434 are introduced into the oxide semiconductor layer 420, so that the oxide semiconductor layer 433 including the low-concentration-oxygen-defect-inducing-factor-containing regions 415a and 415b, the source region 414a, the drain region 414b, and the channel formation region 413 is formed (see FIG. 2C). The concentration of the oxygen-defect-inducing factors 434 in each of the source region 414a and the drain region 414b may be, for example, greater than or equal to $1 \times 10^{19}$ atoms/cm³ and less than or equal to $1 \times 10^{21}$ atoms/cm³. The concentration of the oxygen-defect-inducing factors 434 in each of the low-concentration-oxygen-defect-inducing-factor-containing regions 415a and 415b may be lower than that in each of the source region 414a and the drain region 414b and may be, for example, about $1 \times 10^{18}$ atoms/cm³.

Heat treatment (for example, at a temperature higher than or equal to 200° C. and lower than or equal to 600° C.) may be performed after the introducing treatment of the oxygen-defect-inducing factors 434.

As the oxygen-defect-inducing factors 434, one or more elements selected from titanium (Ti), tungsten (W), molybdenum (Mo), aluminum (Al), cobalt (Co), zinc (Zn), indium (In), silicon (Si), and boron (B) can be used. In addition to the above oxygen-defect-inducing factors, hydrogen and/or nitrogen may be used. Note that metal elements with a high oxygen affinity are preferably used as the oxygen-defect-inducing factors 434.

The oxygen-defect-inducing factors 434 are selectively introduced into the oxide semiconductor layer 420, whereby oxygen defects are effectively induced in the regions into which the oxygen-defect-inducing factors 434 are introduced. The oxygen defects serve as donors; thus, the oxide semiconductor layer 433 including the low-concentration-oxygen-defect-inducing-factor-containing regions 415a and 415b, the source region 414a, and the drain region 414b the resistance of which is selectively reduced can be formed.

Further, a concentration distribution is provided in the region into which the oxygen-defect-inducing factors are introduced and the low-concentration-oxygen-defect-inducing-factor-containing regions 415a and 415b which have higher resistance than the source region and the drain region and have lower resistance than the channel formation region are formed between the high-resistance channel formation region and the low-resistance source region and between the high-resistance channel formation region and the low-resistance drain region, so that the oxide semiconductor layer 433 has a structure in which the conductivity varies from part to part. Thus, electric field concentration can be suppressed and a high electric field can be prevented from being locally applied, so that the withstand voltage of the transistor can be improved; thus, a semiconductor device can have high reliability.

In this embodiment, the gate electrode layer 401 is used as a mask in the introducing treatment of the oxygen-defect-inducing factors 434. Thus, the oxygen-defect-inducing factors 434 are not introduced into a region in the oxide semiconductor layer 433, which overlaps with the gate electrode layer 401, in a self-aligned manner and the region becomes the channel formation region 413; in contrast, the oxygen-defect-inducing factors 434 are introduced into a region which does not overlap with the gate electrode layer 401, so that the source region 414a and the drain region 414b are formed. In addition, parts of the insulating layer 409, which are provided on side surfaces of the gate electrode layer 401, also serve as masks; thus, introduction of the oxygen-defect-inducing factors 434 into regions of the oxide semiconductor layer 420, which overlap with the gate electrode layer 401 and parts of the insulating layer 409, which are provided on the side surfaces of the gate electrode layer 401, is blocked. Note that the oxygen-defect-inducing factors 434 introduced into the source and drain regions move to regions of the oxide semiconductor layer 420, which overlap with the parts of the insulating layer 409, which are provided on the side surfaces of the gate electrode layer 401 (i.e., a region between the channel formation region 413 and the source region 414a and the drain region 414b) to be introduced into the regions; thus, the regions become the low-concentration-oxygen-defect-inducing-factor-containing-regions 415a and 415b.

The oxygen-defect-inducing factors 434 are introduced into the formed oxide semiconductor layer 420 by selectively using an ion implantation method or a doping method.

Note that, in some cases, oxygen-defect-inducing factors are contained even in a region of an oxide semiconductor layer, which overlaps with a mask (the gate electrode layer 401 in this embodiment), depending on the introducing conditions (e.g., acceleration energy and the injection amount or dose of oxygen-defect-inducing factors). Thus, the region into which oxygen-defect-inducing factors are introduced can be controlled by setting introducing conditions and the thickness and size of a mask as appropriate.

As in this embodiment, in the case where the oxygen-defect-inducing factors 434 which have passed through the insulating layer 409 and introduced into the source region 414a and the drain region 414b move to regions, and the regions become the low-concentration-oxygen-defect-inducing-factor-containing regions 415a and 415b, the width in the channel length direction of each of the low-concentration-oxygen-defect-inducing-factor-containing region 415a and 415b (e.g., greater than or equal to 20 nm and less than or equal to 1 µm, typically greater than or equal to 20 nm and less than or equal to 200 nm) can be determined by adjusting the thickness of the insulating layer 409 and the acceleration energy.

Although the example in which the low-concentration-oxygen-defect-inducing-factor-containing region 415a and 415b, the source region 414a, and the drain region 414b are formed in a self-aligned manner by one introducing treatment of oxygen-defect-inducing factors is described with reference to FIGS. 2A to 2D, introducing treatment of oxygen-defect-inducing factors may be performed plural times. An example in which introducing treatment of oxygen-defect-inducing factors is performed twice will be described with reference to FIGS. 3A to 3D.

Figure 3A:
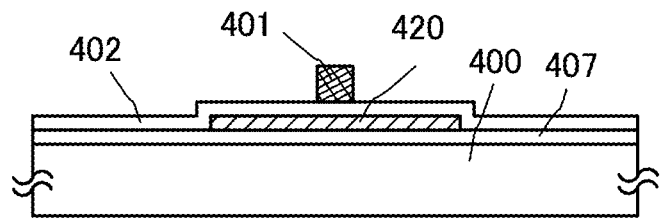
FIGS. 3A to 3D illustrate one embodiment of a semiconductor device and a method for manufacturing the semiconductor device.

As in FIG. 2A, the island-shaped oxide semiconductor layer 420, the gate insulating layer 402, and the gate electrode layer 401 are formed over the substrate 400 provided with the insulating layer 407 (see FIG. 3A).

Figure 3B:
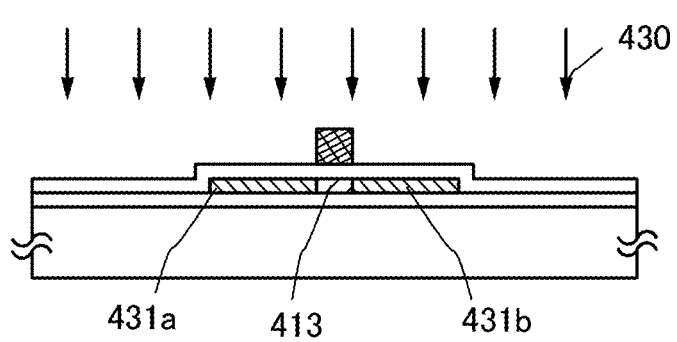

Next, oxygen-defect-inducing factors 430 are selectively introduced into the oxide semiconductor layer 420, using the gate electrode layer 401 as a mask, so that the channel formation region 413 and oxygen-defect-inducing-factor-containing regions 431a and 431b are formed (see FIG. 3B). The concentration of the oxygen-defect-inducing factors 430 in each of the oxygen-defect-inducing-factor-containing regions 431a and 431b may be, for example, about $1 \times 10^{18}$ atoms/cm$^3$.

Next, the insulating layer 409 for covering the oxide semiconductor layer including the channel formation region 413 and the oxygen-defect-inducing-factor-containing regions 431a and 431b, the gate insulating layer 402, and the gate electrode layer 401 is formed.

Figure 3C:
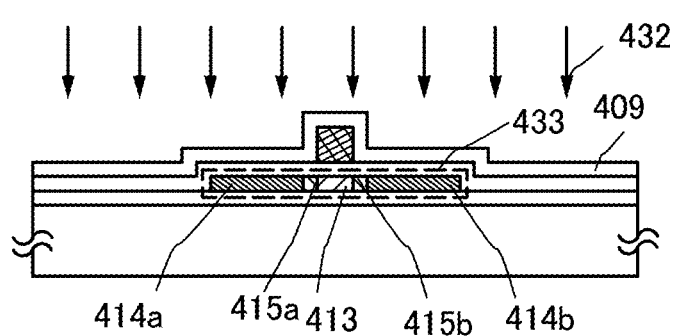
Figure 3D:
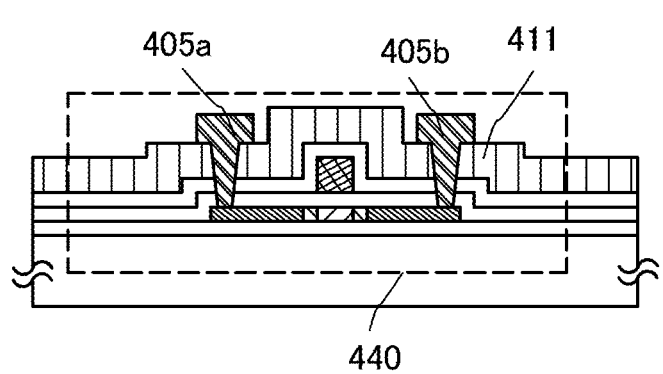

Next, oxygen-defect-inducing factors 432 are introduced into the oxygen-defect-inducing-factor-containing regions 431a and 431b of the oxide semiconductor layer, so that the oxide semiconductor layer 433 including the low-concentration-oxygen-defect-inducing-factor-containing regions 415a and 415b, the source region 414a, the drain region 414b, and the channel formation region 413 is formed (see FIG. 3C). The concentration of the oxygen-defect-inducing factors 432 in each of the source region 414a and the drain region 414b may be, for example, greater than or equal to $1 \times 10^{19}$ atoms/cm$^3$ and less than or equal to $1 \times 10^{21}$ atoms/cm$^3$.

Heat treatment (for example, at a temperature higher than or equal to 200° C. and lower than or equal to 600° C.) may be performed after the introducing treatment of oxygen-defect-inducing factors 432.

Further, parts of the insulating layer 409, which are provided on side surfaces of the gate electrode layer 401, also serve as masks; thus, introduction of the oxygen-defect-inducing factors 432 into regions of the oxide semiconductor layer 420, which overlap with the parts of the insulating layer 409, which are provided on the side surfaces of the gate electrode layer 401, is blocked. Accordingly, the regions become the low-concentration-oxygen-defect-inducing-factor-containing regions 415a and 415b.

As the oxygen-defect-inducing factors 430 and 432, a material similar to that of the oxygen-defect-inducing factors 434 can be used.

Note that in the case where introducing treatment of oxygen-defect-inducing factors is performed on the channel formation region 413, the oxygen-defect-inducing factors are introduced so that the concentration thereof in the channel formation region 413 is lower than that in each of the low-concentration-oxygen-defect-inducing-factor-containing regions 415a and 415b, the source region 414a, and the drain region 414b. As in this embodiment, in the case where the concentration of oxygen-defect-inducing factors in each of the source region 414a and the drain region 414b is greater than or equal to $1 \times 10^{19}$ atoms/cm$^3$ and less than or equal to $1 \times 10^{21}$ atoms/cm$^3$ and the concentration of oxygen-defect-inducing factors in each of the low-concentration-oxygen-defect-inducing-factor-containing regions 415a and 415b is about $1 \times 10^{18}$ atoms/cm$^3$, the concentration of oxygen-defect-inducing factors in the channel formation region 413 may be, for example, less than $1 \times 10^{14}$ atoms/cm$^3$.

After the introducing treatment illustrated in FIG. 3C, the insulating layer 411 is formed over the insulating layer 409. Openings (contact holes) which reach the source region 414a and the drain region 414b are formed in the insulating layer 409 and the insulating layer 411. A conductive film is formed in the openings and the conductive film is processed by etching, so that the source electrode layer 405a and the drain electrode layer 405b which are in contact with and electrically connected to the source region 414a and the drain region 414b, respectively are formed (see FIG. 3D). Through the above-described steps, the transistor 440 can be manufactured.

In the transistor 440 which includes the oxide semiconductor layer 433 including the low-concentration-oxygen-defect-inducing-factor-containing regions 415a and 415b and the source region 414a and the drain region 414b which are high-concentration oxygen-defect-inducing-factor-containing regions the resistance of which is reduced by introducing the oxygen-defect-inducing factors, contact resistance between the oxide semiconductor layer 433 and the source electrode layer 405a and between the oxide semiconductor layer 433 and the drain electrode layer 405b can be reduced; thus, on-state characteristics (e.g., on-state current or field-effect mobility) are improved. Thus, the transistor can have good electric characteristics.

The transistor with good electric characteristics is capable of high-speed response and high-speed operation. Thus, the semiconductor device including the transistor can have high performance.

Furthermore, the oxide semiconductor layer in which the conductivity varies from part to part is provided, whereby electric field concentration of the transistor can be suppressed and a high electric field can be prevented from being locally applied. Thus, the withstand voltage of the transistor can be improved, which results in high reliability of the semiconductor device.

(Embodiment 3)

In this embodiment, another embodiment of a semiconductor device and a method for manufacturing the semiconductor device will be described with reference to FIGS. 11A to 11D. In this embodiment, a transistor will be described as an example of the semiconductor device. An example in which a formation step and a structure of a source and drain electrode layers are different from those of the transistor described in Embodiment 1 or 2 will be described. Therefore, the same portions as in the above embodiments and portions having functions similar to those of the portions in the above embodiments are formed in a manner similar to that of the above embodiments and steps similar to those in the above embodiments can be performed in a manner similar to that of the above embodiments, and the description thereof is not repeated. In addition, detailed description of the same portions is not given.

In Embodiments 1 and 2, the example in which the source electrode layer and the drain electrode layer are formed over the insulating layers provided over the oxide semiconductor layer and are electrically connected to the oxide semiconductor layer through the contact holes formed in the insulating layers is described. In this embodiment, in contrast, a source electrode layer and a drain electrode layer are formed directly on an oxide semiconductor layer without an insulating layer interposed therebetween.

An example of a transistor and a method for manufacturing the transistor will be described with reference to FIGS. 11A to 11D.

Figure 11A:
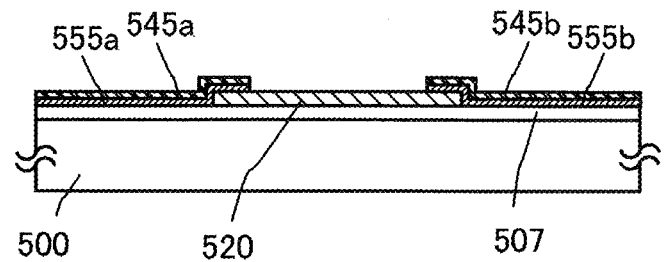
FIGS. 11A to 11D illustrate one embodiment of a semiconductor device and a method for manufacturing the semiconductor device.
Figure 11B:
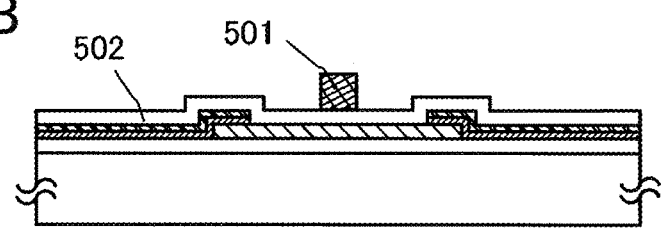
Figure 11C:
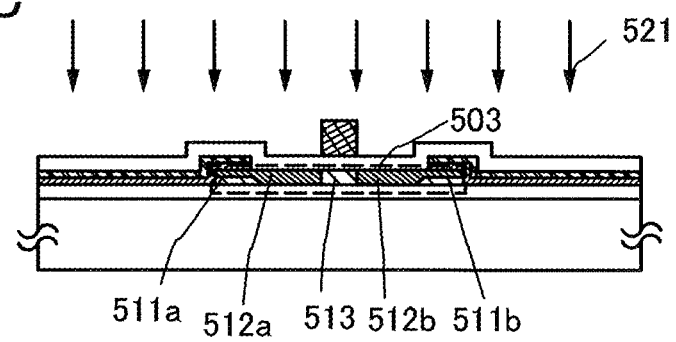
Figure 11D:
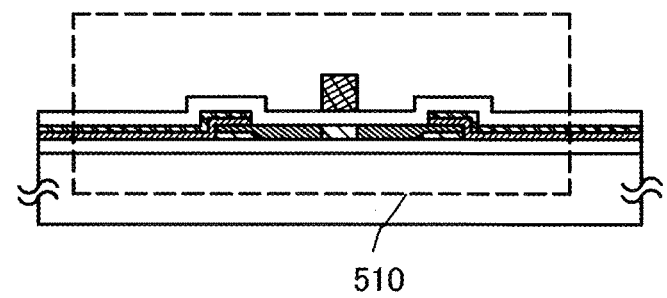

A transistor 510 illustrated in FIG. 11D is a top-gate thin film transistor.

The transistor 510 includes, over a substrate 500 having an insulating surface, an insulating layer 507; an oxide semiconductor layer 503 including a channel formation region 513, regions 511a and 511b into which oxygen-defect-inducing factors are not introduced (hereinafter, oxygen-defect-inducing-factor-non-introduced regions 511a and 511b), a source region 512a containing oxygen-defect-inducing factors, a drain region 512b containing oxygen-defect-inducing factors; a first source electrode layer 555a; a first drain electrode layer 555b; a second source electrode layer 545a; a second drain electrode layer 545b; a gate insulating layer 502; and a gate electrode layer 501.

The source region 512a and the drain region 512b are formed in regions in the oxide semiconductor layer 503, which are not covered with the gate electrode layer 501, the first source electrode layer 555a, the first drain electrode layer 555b, the second source electrode layer 545a, and the second drain electrode layer 545b, and are formed in surface parts of the oxide semiconductor layer 503, which are covered with the first source electrode layer 555a, the first drain electrode layer 555b, the second source electrode layer 545a, and the second drain electrode layer 545b. The source region 512a and the drain region 512b are low-resistance regions in which donors are formed by oxygen-defect-inducing factors 521.

On the other hand, in the oxide semiconductor layer 503, the oxygen-defect-inducing-factor-non-introduced regions 511a and 511b, which overlap with the first source electrode layer 555a and the first drain electrode layer 555b and are provided near an interface with the insulating layer 507 do not contain the oxygen-defect-inducing factors 521.

Note that the oxygen-defect-inducing factors 521 may also be introduced into the channel formation region 513 in the oxide semiconductor layer 503. In that case, introducing treatment of the oxygen-defect-inducing factors 521 is performed on the oxide semiconductor layer 520 before the gate electrode layer 501 is formed. The introducing treatment of the oxygen-defect-inducing factors 521 may be performed before an oxide semiconductor film is processed into an island-shaped oxide semiconductor layer. In the case where the oxygen-defect-inducing factors 521 are also introduced into the channel formation region 513, they are introduced into the entire oxide semiconductor layer 503; thus, the oxygen-defect-inducing factors 521 are also contained in the oxygen-defect-inducing-factor-non-introduced regions 511a and 511b at the same concentration as those in the channel formation region.

The oxygen-defect-inducing factors 521 are also introduced into the channel formation region 513 to reduce the resistance (for example, the channel formation region 513 is made to have n⁻ type conductivity) using oxygen defects as donors, whereby the electric characteristics of the transistor can be controlled.

Heat treatment (for example, at a temperature higher than or equal to 200° C. and lower than or equal to 600° C.) may be performed after the introducing treatment of the oxygen-defect-inducing factors 521.

The concentration of oxygen-defect-inducing factors in the channel formation region 513 is lower than that in each of the source region 512a and the drain region 512b. As in this embodiment, in the case where the concentration of oxygen-defect-inducing factors in each of the source region 512a and the drain region 512b is greater than or equal to $1\times10^{19}$ atoms/cm³ and less than or equal to $1\times10^{21}$ atoms/cm³, the concentration of oxygen-defect-inducing factors in the channel formation region 513 may be, for example, less than $1\times10^{14}$ atoms/cm³.

A process of manufacturing the transistor 510 over the substrate 500 will be described below with reference to FIGS. 11A to 11D.

The island-shaped oxide semiconductor layer 520 is provided over the substrate 500 provided with the insulating layer 507. A stack of the first source electrode layer 555a and the second source electrode layer 545a is formed in contact with one of edge portions of the oxide semiconductor layer 520, and a stack of the first drain electrode layer 555b and the second drain electrode layer 545b is formed in contact with the other edge portion of the oxide semiconductor layer 520.

A metal nitride layer is preferably used as the first source electrode layer 555a and the first drain electrode layer 555b which are in contact with the oxide semiconductor layer 520, and a metal layer is preferably used as the second source electrode layer 545a and the second drain electrode layer 545b. In this embodiment, a titanium nitride film is used as the first source electrode layer 555a and the first drain electrode layer 555b, and a titanium film is used as the second source electrode layer 545a and the second drain electrode layer 545b.

The first source electrode layer 555a, the first drain electrode layer 555b, the second source electrode layer 545a, and the second drain electrode layer 545b are thin conductive films.

The gate insulating layer 502 is formed over the oxide semiconductor layer 520, the first source electrode layer 555a, the first drain electrode layer 555b, the second source electrode layer 545a, and the second drain electrode layer 545b; and the gate electrode layer 501 is formed over the gate insulating layer 502 (see FIG. 11B).

Next, the oxygen-defect-inducing factors 521 are introduced into the oxide semiconductor layer 520, so that the oxide semiconductor layer 503 including the source region 512a, the drain region 512b, the channel formation region 513, and the oxygen-defect-inducing-factor-non-introduced regions 511a and 511b is formed (see FIG. 11C). The concentration of the oxygen-defect-inducing factors 521 in each of the source region 512a and the drain region 512b may be, for example, greater than or equal to $1\times10^{19}$ atoms/cm³ and less than or equal to $1\times10^{21}$ atoms/cm³.

Heat treatment (for example, at a temperature higher than or equal to 200° C. and lower than or equal to 600° C.) may be performed after the introducing treatment of the oxygen-defect-inducing factors 521.

As the oxygen-defect-inducing factors 521, one or more elements selected from titanium (Ti), tungsten (W), molybdenum (Mo), aluminum (Al), cobalt (Co), zinc (Zn), indium (In), silicon (Si), and boron (B) can be used. In addition to the above oxygen-defect-inducing factors 521, hydrogen and/or nitrogen may be used. Note that metal elements with a high oxygen affinity are preferably used as the oxygen-defect-inducing factors 521.

The oxygen-defect-inducing factors 521 are selectively introduced into the oxide semiconductor layer 520, whereby oxygen defects are effectively induced in the regions into which the oxygen-defect-inducing factors 521 are introduced. The oxygen defects serve as donors; thus, the oxide semiconductor layer 503 including the source region 512a and the drain region 512b the resistance of which is selectively reduced can be formed.

In this embodiment, the oxygen-defect-inducing factors 521 are introduced into the oxide semiconductor layer 520, using the gate electrode layer 501 as a mask. The oxygen-defect-inducing factors 521 pass through the gate insulating layer 502, the first source electrode layer 555a, the first drain electrode layer 555b, the second source electrode layer 545a, and the second drain electrode layer 545b to be introduced into the oxide semiconductor layer 520.

The oxygen-defect-inducing factors 521 are not introduced into a region which overlaps with the gate electrode layer 501, and the region becomes the channel formation region 513.

The first source electrode layer 555a, the first drain electrode layer 555b, the second source electrode layer 545a, and the second drain electrode layer 545b are thin conductive films and introducing conditions of the oxygen-defect-inducing factors 521 are controlled, whereby the oxygen-defect-inducing factors 521 can pass through the first source electrode layer 555a, the first drain electrode layer 555b, the second source electrode layer 545a, and the second drain electrode layer 545b to be introduced into regions near interfaces with the oxide semiconductor layer 520. Thus, as illustrated in FIG. 11C, the source region 512a and the drain region 512b which contain the oxygen-defect-inducing factors 521 can also be formed near the interfaces between the oxide semiconductor layer 503 and the first source electrode layer 555a and between the oxide semiconductor layer 503 and the first drain electrode layer 555b. Thus, the oxide semiconductor layer 503 can be connected to the first source electrode layer 555a or the first drain electrode layer 555b through the source region 512a or the drain region 512b which has low resistance.

Meanwhile, in parts of the oxide semiconductor layer 503, which overlap with the first source electrode layer 555a and the first drain electrode layer 555b, the oxygen-defect-inducing-factor-non-introduced regions 511a and 511b, i.e., regions into which the oxygen-defect-inducing factors 521 are not introduced are formed near interfaces with the insulating layer 507. The oxygen-defect-inducing factors introduced through the introducing treatment are not contained in the oxygen-defect-inducing-factor-non-introduced regions 511a and 511b and the channel formation region 513.

Through the above-described steps, the transistor 510 can be manufactured.

In the transistor 510 which includes the oxide semiconductor layer 503 including the source region 512a and the drain region 512b the resistance of which is reduced by introducing the oxygen-defect-inducing factors 521, contact resistance between the oxide semiconductor layer 503 and the first source electrode layer 555a and between the oxide semiconductor layer 503 and the first drain electrode layer 555b can be reduced; thus, on-state characteristics (e.g., on-state current or field-effect mobility) are improved. Thus, a transistor with good electric characteristics can be obtained.

The transistor with good electric characteristics is capable of high-speed response and high-speed operation. Thus, the semiconductor device including the transistor can have high performance.

Alternatively, as in Embodiment 2, a structure in which regions containing oxygen-defect-inducing factors at lower concentration than the source region and the drain region are provided between the channel formation region and the source and drain regions may be employed.

The oxide semiconductor layer in which the conductivity varies from part to part is provided, whereby electric field concentration of the transistor can be suppressed and a high electric field can be prevented from being locally applied. Thus, the withstand voltage of the transistor can be improved, which results in high reliability of the semiconductor device.

This embodiment can be implemented in appropriate combination with any of the other embodiments.

(Embodiment 4)

In this embodiment, examples of transistors each including an oxide semiconductor layer and methods for manufacturing the transistors will be described in detail below with reference to FIGS. 12A to 12E and FIGS. 13A to 13C. The same portions as in the above embodiments and portions having functions similar to those of the portions in the above embodiments are formed in a manner similar to that of the above embodiments and steps similar to those in the above embodiments can be performed in a manner similar to that of the above embodiments, and the description thereof is not repeated. In addition, detailed description of the same portions is not given.

Figure 12A:
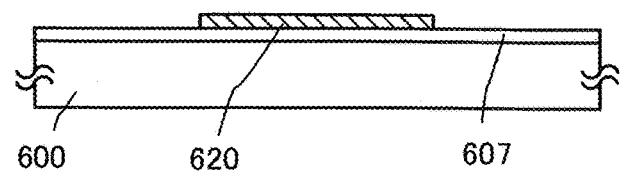
FIGS. 12A to 12E illustrate one embodiment of a semiconductor device and a method for manufacturing the semiconductor device.
Figure 12B:
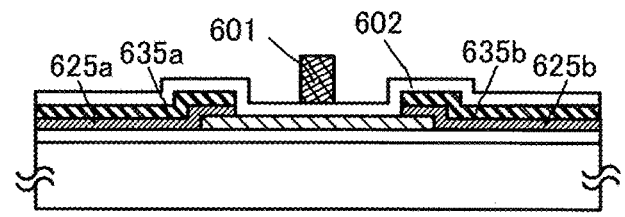
Figure 12C:
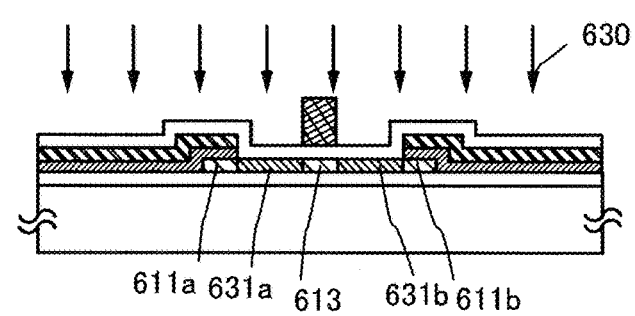
Figure 12D:
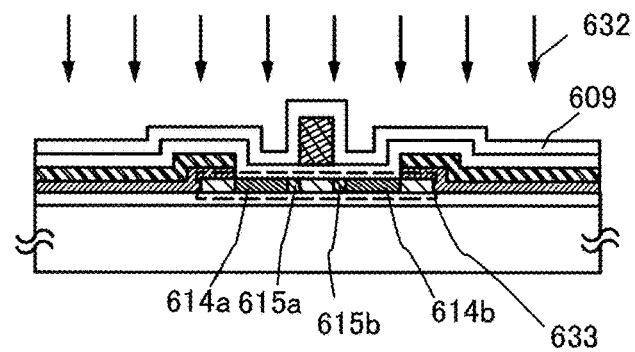
Figure 12E:
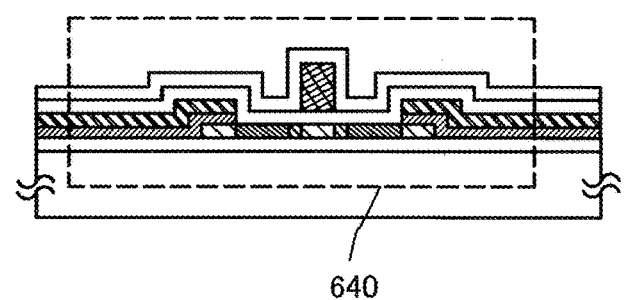
Figure 13A:
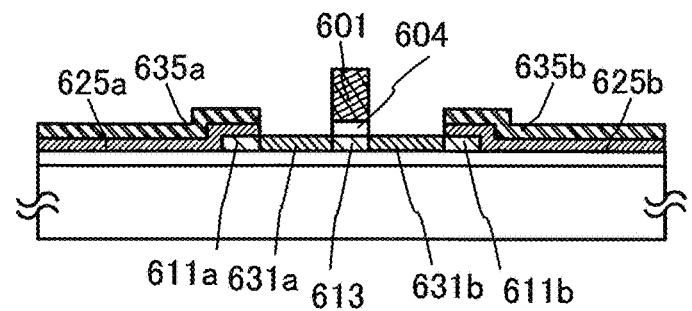
FIGS. 13A to 13C illustrate one embodiment of a semiconductor device and a method for manufacturing the semiconductor device.
Figure 13B:
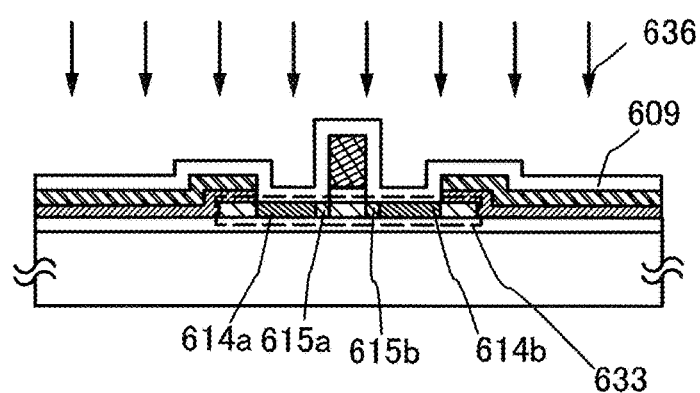
Figure 13C:
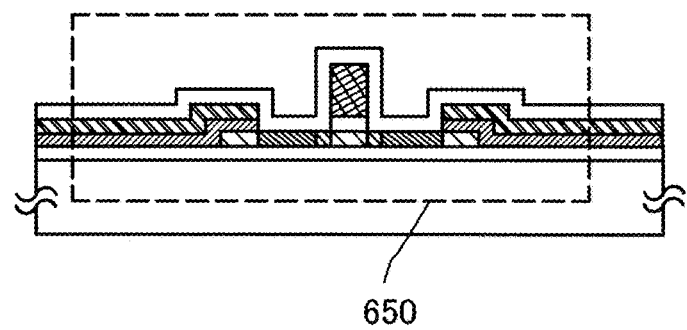

Examples of cross-sectional structures of transistors are illustrated in FIGS. 12A to 12E and FIGS. 13A to 13C. A transistor 640 illustrated in FIG. 12E and a transistor 650 illustrated in FIG. 13C are top-gate thin film transistors which are similar to the transistor 510 illustrated in FIG. 11D.

An oxide semiconductor layer in this embodiment is made to be intrinsic (i-type) or substantially intrinsic by removing hydrogen which is an n-type impurity from the oxide semiconductor layer and increasing the purity so that impurities that are not main components of the oxide semiconductor layer are not contained as much as possible, before introducing oxygen-defect-inducing factors. In other words, purified intrinsic (i-type) semiconductor or a semiconductor close thereto is obtained by removing impurities such as hydrogen or water as much as possible.

Further, a very small number of (close to zero) carriers are contained in the above purified oxide semiconductor, and the carrier concentration is less than $1\times10^{14}/cm^3$, preferably less than $1\times10^{12}/cm^3$, more preferably less than $1\times10^{11}/cm^3$.

Since a very small number of carriers are contained in the oxide semiconductor layer, off-state current can be reduced. It is preferable that off-state current be as low as possible.

Specifically, the off-state current per micrometer of channel width of the transistor including the above oxide semiconductor layer can be less than or equal to $1\times10^4$ zA/μm ($1\times10^{-17}$ A/μm) and, furthermore, less than or equal to $1\times10^3$ zA/μm ($1\times10^{-18}$ A/μm).

Note that the resistance to flow of off-state current in a transistor can be referred to as off-state resistivity. The off-state resistivity is the resistivity of a channel formation region at the time when the transistor is off, which can be calculated from off-state current.

The off-state resistivity of the transistor which includes the oxide semiconductor layer of this embodiment is preferably greater than or equal to $1\times10^9$ Ω·m, more preferably greater than or equal to $1\times10^{10}$ Ω·m.

Further, the temperature dependence of on-state current can hardly be observed and the off-state current remains very low in the transistors 640 and 650 each including the above oxide semiconductor layer.

A process of manufacturing the transistor 640 over a substrate 600 having an insulating surface will be described below with reference to FIGS. 12A to 12E.

As the substrate 600, a substrate similar to the substrate 400 described in Embodiment 1 can be used. In this embodiment, a glass substrate is used as the substrate 600.

An insulating layer 607 which serves as a base film is formed over the substrate 600. It is preferable that the insulating layer 607 which is in contact with an oxide semiconductor layer 620 be formed using an oxide insulating layer such as a silicon oxide layer, a silicon oxynitride layer, an aluminum oxide layer, or an aluminum oxynitride layer. The insulating layer 607 can be formed by a plasma CVD method, a sputtering method, or the like. In order to prevent the insulating layer 607 from containing hydrogen, the insulating layer 607 is preferably formed by a sputtering method.

In this embodiment, as the insulating layer 607, a silicon oxide layer is formed by a sputtering method. The silicon oxide layer is formed as the insulating layer 607 over the substrate 600 in such a manner that the substrate 600 is transferred to a treatment chamber, a sputtering gas which contains high-purity oxygen and from which hydrogen and moisture have been removed is introduced, and a silicon semiconductor target is used. The substrate 600 may be at room temperature or may be heated.

For example, a silicon oxide film is deposited by an RF sputtering method under the following conditions: quartz (preferably synthetic quartz) is used, the substrate temperature is 108° C., the distance between the substrate and a target (the T-S distance) is 60 mm, the pressure is 0.4 Pa, the high-frequency power is 1.5 kW, and the atmosphere contains oxygen and argon (the flow ratio of oxygen to argon is 1:1 (each flow rate is 25 sccm)). The thickness of the silicon oxide film is 100 nm. Note that instead of quartz (preferably synthetic quartz), a silicon target can be used as a target used for forming the silicon oxide film. As a sputtering gas, oxygen or a mixed gas of oxygen and argon is used.

In that case, it is preferable that the insulating layer 607 be formed while moisture which remains in the treatment chamber is removed so that hydrogen, a hydroxyl group, or moisture is prevented from being contained in the insulating layer 607.

In order to remove moisture which remains in the treatment chamber, an entrapment vacuum pump is preferably used. For example, a cryopump, an ion pump, or a titanium sublimation pump is preferably used. The evacuation unit may be a turbo pump provided with a cold trap. From the treatment chamber which is evacuated with a cryopump, a hydrogen atom, a compound containing a hydrogen atom, such as water ($H_2O$), and the like are removed; thus, the concentration of impurities in the insulating layer 607 formed in the treatment chamber can be reduced.

The insulating layer 607 may have a stacked-layer structure in which, for example, a nitride insulating layer such as a silicon nitride layer, a silicon nitride oxide layer, an aluminum nitride layer, or an aluminum nitride oxide layer and the above oxide insulating layer are stacked in this order over the substrate 600.

For example, a silicon nitride layer is formed using a silicon target by introducing a sputtering gas which contains high-purity nitrogen and from which hydrogen and moisture have been removed, to a space between the silicon oxide layer and the substrate. In this case also, it is preferable that the silicon nitride layer be formed while moisture which remains in the treatment chamber is removed in a manner similar to that of the silicon oxide layer. Also in the case where the silicon nitride layer is formed, the substrate may be heated at the time of deposition.

In the case where a silicon nitride layer and a silicon oxide layer are stacked to form the insulating layer 607, the silicon nitride layer and the silicon oxide layer can be formed in the same treatment chamber with the use of the same silicon target. First, a sputtering gas containing nitrogen is introduced into the treatment chamber and a silicon nitride layer is formed using a silicon target provided in the treatment chamber, and then the sputtering gas is switched to a sputtering gas containing oxygen and a silicon oxide layer is formed using the same silicon target. Since the silicon nitride layer and the silicon oxide layer can be formed in succession without being exposed to air, impurities such as hydrogen or moisture can be prevented from being adsorbed on a surface of the silicon nitride layer.

Next, over the insulating layer 607, an oxide semiconductor film is formed to a thickness of greater than or equal to 2 nm and less than or equal to 200 nm, preferably greater than or equal to 5 nm and less than or equal to 30 nm.

Note that before the oxide semiconductor film is formed by a sputtering method, powdery substances (also referred to as particles or dust) attached to a surface of the insulating layer 607 are preferably removed by reverse sputtering in which plasma is generated by introduction of an argon gas. The reverse sputtering is a method in which voltage is applied to a substrate side, not to a target side, using an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used.

As an oxide semiconductor used for the oxide semiconductor film, an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor which are two-component metal oxides; an In—O-based oxide semiconductor, a Sn—O-based oxide semiconductor, or a Zn—O-based oxide semiconductor can be used. The above oxide semiconductor film may contain $SiO_2$. In this embodiment, the oxide semiconductor film is formed by a sputtering method with the use of an In—Ga—Zn—O-based oxide semiconductor target. In addition, the oxide semiconductor film can be formed by a sputtering method in a rare gas (typically argon) atmosphere, an oxygen atmosphere, or an atmosphere of a rare gas (typically argon) and oxygen.

As a target for forming the oxide semiconductor film by a sputtering method, for example, a target having a composition ratio of $In_2O_3$ to $Ga_2O_3$ and ZnO of 1:1:1 [molar ratio] (i.e., In:Ga:Zn=1:1:0.5 [atomic ratio]) can be used. Alternatively, a target having a composition ratio of In to Ga and Zn of 1:1:1 [atomic ratio] or a composition ratio of In to Ga and Zn of 1:1:2 [atomic ratio] may be used. The filling rate of the metal oxide target is greater than or equal to 90% and less than or equal to 100%, preferably greater than or equal to 95% and less than or equal to 99.9%. An oxide semiconductor film which is formed using an oxide semiconductor target for film formation, which has a high filling rate, is dense.

It is preferable that a high-purity gas from which impurities such as hydrogen, water, hydroxyl, or hydride have been removed be used as a sputtering gas used for forming the oxide semiconductor film.

The substrate is held in a treatment chamber kept under reduced pressure, and the substrate temperature is set to a temperature higher than or equal to 100° C. and lower than or equal to 600° C., preferably a temperature higher than or equal to 200° C. and lower than or equal to 400° C. Film formation is performed while the substrate is heated, whereby the concentration of impurities contained in the formed oxide semiconductor film can be reduced. In addition, damage due to sputtering can be reduced. Then, a sputtering gas from which hydrogen and moisture have been removed is introduced into the treatment chamber while moisture which remains therein is removed, and the oxide semiconductor film is formed over the substrate 600 with the use of the above target. In order to remove moisture which remains in the treatment chamber, an entrapment vacuum pump such as a cryopump is preferably used. From the treatment chamber which is evacuated with a cryopump, hydrogen, a compound containing a hydrogen atom, such as water ($H_2O$) (preferably also a compound containing a carbon atom), and the like are removed, whereby the concentration of impurities in the oxide semiconductor film formed in the treatment chamber can be reduced.

As an example of the deposition condition, the following conditions are employed: the distance between the substrate and the target is 100 mm, the pressure is 0.6 Pa, the direct-current (DC) power is 0.5 kW, and the atmosphere is an oxygen atmosphere (the proportion of oxygen flow: 100%). Note that a pulsed direct-current (DC) power source is preferably used, in which case powder substances (also referred to as particles or dust) that are generated in deposition can be reduced and the film thickness can be uniform. Note that the appropriate thickness of the oxide semiconductor film varies depending on the oxide semiconductor material, and the thickness may be determined as appropriate depending on the material.

Next, the oxide semiconductor film is processed into the island-shape oxide semiconductor layer 620 in a photolithography step. A resist mask for forming the island-shaped oxide semiconductor layer 620 may be formed by an ink-jet method. Formation of the resist mask by an ink-jet method needs no photomask; thus, the manufacturing cost can be reduced.

Note that the etching of the oxide semiconductor film may be dry etching, wet etching, or both dry etching and wet etching.

As an etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, an ammonia peroxide mixture (ratio of hydrogen peroxide water of 31 wt % to ammonia water of 28 wt % and water is 5:2:2), or the like can be used. Alternatively, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium contained in the oxide semiconductor layer is collected from the waste liquid after the etching and reused, the resources can be efficiently used and the cost can be reduced.

The etching conditions (such as an etchant, etching time, and temperature) are adjusted as appropriate depending on the material so that the oxide semiconductor film can be etched into a desired shape.

Next, first heat treatment is performed on the oxide semiconductor layer 620. The oxide semiconductor layer 620 can be dehydrated or dehydrogenated by the first heat treatment. The temperature of the first heat treatment is higher than or equal to 400° C. and lower than or equal to 750° C., preferably higher than or equal to 400° C. and lower than the strain point of the substrate.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows: the substrate is transferred and put in an inert gas heated to a temperature as high as 650° C. to 700° C., heated for several minutes, and is transferred and taken out of the inert gas which has been heated to the high temperature. GRTA enables high-temperature heat treatment in a short time.

Note that it is preferable that in the first heat treatment, water, hydrogen, and the like be not contained in a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

As heat treatment for dehydration or dehydrogenation, the oxide semiconductor layer may be heated, and cooling may be performed by introducing a high-purity oxygen gas, a high-purity $N_2O$ gas, or ultra-dry air (having a dew point of $-40°$ C. or lower, preferably $-60°$ C. or lower) into the same furnace. It is preferable that the oxygen gas or the $N_2O$ gas do not contain water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the $N_2O$ gas is 1 ppm or lower, preferably 0.1 ppm or lower). By supplying oxygen which is a main component for forming an oxide semiconductor and has been reduced because of the step of removing impurities through the dehydration or the dehydrogenation, the purity of the oxide semiconductor layer 620 is increased and the oxide semiconductor layer 620 is made to be electrically i-type (intrinsic).

In this embodiment, the substrate 600 is put in an electric furnace that is a kind of heat treatment apparatus and first heat treatment is performed on the oxide semiconductor layer at 450° C. in a nitrogen atmosphere for one hour, and then water and hydrogen are prevented from entering the oxide semiconductor layer with the oxide semiconductor layer not exposed to air; thus, the oxide semiconductor layer 620 is obtained. In the case where the heat treatment for dehydration or dehydrogenation is performed in an atmosphere of an inert gas such as nitrogen or a rare gas as described above, the oxide semiconductor layer 620 after being subjected to the heat treatment has n-type conductivity and the resistance thereof is reduced because of oxygen defects.

Further, depending on the conditions of the first heat treatment or the material for the oxide semiconductor layer, the oxide semiconductor layer 620 might be crystallized to be a microcrystalline film or a polycrystalline film. Further, depending on the conditions of the first heat treatment and the material for the oxide semiconductor film, the oxide semiconductor film might become an amorphous oxide semiconductor film containing no crystalline components.

The first heat treatment can be performed on the oxide semiconductor film before being processed into the island-like oxide semiconductor layer 620. In that case, the substrate is taken out of the heating apparatus after the first heat treatment, and then a photolithography step is performed.

The transistor 640 and the transistor 650 in each of which regions which contain oxygen-defect-inducing factors at lower concentration than a source region and a drain region with the use of the oxide semiconductor layer 620 are provided between a channel formation region and a source region and between a channel formation region and a drain region will be described with reference to FIGS. 12A to 12E and FIGS. 13A to 13C, respectively.

The oxide semiconductor layer 620 is formed over the substrate 600 having an insulating surface and being provided with the insulating layer 607 (see FIG. 12A).

A stack of a first source electrode layer 625a and a second source electrode layer 635a is formed in contact with one of edge portions of the oxide semiconductor layer 620, and a stack of a first drain electrode layer 625b and a second drain electrode layer 635b is formed in contact with the other edge portion of the oxide semiconductor layer 620.

A metal nitride layer is preferably used as the first source electrode layer 625a and the first drain electrode layer 625b which are in contact with the oxide semiconductor layer 620, and a metal layer is preferably used as the second source electrode layer 635a and the second drain electrode layer 635b. In this embodiment, a titanium nitride film is used as the first source electrode layer 625a and the first drain electrode layer 625b, and a stack of an aluminum film and a titanium film is used as the second source electrode layer 635a and the second drain electrode layer 635b.

A gate insulating layer 602 is formed over the oxide semiconductor layer 620, the first source electrode layer 625a, the first drain electrode layer 625b, the second source electrode layer 635a, and the second drain electrode layer 635b.

The insulating layer 602 can be formed to have a thickness of at least 1 nm using a method by which impurities such as water or hydrogen are prevented from entering the insulating layer 602 such as a sputtering method, as appropriate.

In this embodiment, as the gate insulating layer 602, a silicon oxide film is formed to a thickness of 100 nm by a sputtering method. The substrate temperature in the film formation may be higher than or equal to room temperature and lower than or equal to 300° C., and is 100° C. in this embodiment. The formation of the silicon oxide film by a sputtering method can be performed in an atmosphere of a rare gas (typically, argon), an oxygen atmosphere, or an atmosphere containing oxygen and a rare gas (typically, argon). As a target, a silicon oxide target or a silicon target can be used. For example, the silicon oxide film can be formed by a sputtering method with the use of a silicon target in an atmosphere containing oxygen and nitrogen. As the gate insulating layer 602 which is formed in contact with the oxide semiconductor layer 620, an inorganic insulating film which does not contain impurities such as moisture, a hydrogen ion, or $OH^-$ and blocks entry of these from the outside is used. Typically, a silicon oxide film, a silicon oxynitride film, an aluminum oxide film, an aluminum oxynitride film, or the like is used.

In that case, it is preferable that the insulating layer 602 be formed while moisture which remains in the treatment chamber is removed so that hydrogen, a hydroxyl group, or moisture is prevented from being contained in the oxide semiconductor layer 620 and the insulating layer 602.

In order to remove moisture which remains in the treatment chamber, an entrapment vacuum pump such as a cryopump is preferably used. From the treatment chamber which is evacuated with a cryopump, hydrogen, a compound containing a hydrogen atom, such as water ($H_2O$), and the like are removed, whereby the concentration of impurities in the gate insulating layer 602 formed in the treatment chamber can be reduced.

Next, second heat treatment (for example, at a temperature higher than or equal to 200° C. and lower than or equal to 400° C., preferably a temperature higher than or equal to 250° C. and lower than or equal to 350° C.) is performed in an inert gas atmosphere or an oxygen gas atmosphere. For example, the second heat treatment is performed at 250° C. in a nitrogen atmosphere for one hour. When the second heat treatment is performed, heat is applied while part of the oxide semiconductor layer (at least the channel formation region is included) is in contact with the gate insulating layer 602.

Through the above-described steps, by performing heat treatment for dehydration or dehydrogenation on the oxide semiconductor layer after deposition, impurities such as hydrogen, moisture, a hydroxyl group, or hydride (also referred to as a hydrogen compound) can be intentionally removed from the oxide semiconductor layer, and additionally, oxygen which is a main component of an oxide semiconductor and is reduced in the step of removing impurities can be supplied. Accordingly, part of the oxide semiconductor layer which includes at least the channel formation region is purified and is made to be electrically i-type (intrinsic).

In this embodiment, oxygen is not supplied to a region in the oxide semiconductor layer 620, which is not directly in contact with the gate insulating layer 602 and overlaps with the first source electrode layer 625a or the first drain electrode layer 625b; thus, the resistance of the region is kept low.

A gate electrode layer 601 is formed over the gate insulating layer 602 (see FIG. 12B).

Note that introducing treatment of oxygen-defect-inducing factors may also be performed on a region in the oxide semiconductor layer 620, which corresponds to the channel formation region (i.e., a region which overlaps with the gate electrode layer 601) so that the oxygen-defect-inducing factors are contained in the region. In that case, introducing treatment of oxygen-defect-inducing factors is performed on the oxide semiconductor layer 620 before formation of the gate electrode layer 601. The introducing treatment of oxygen-defect-inducing factors may be performed before the oxide semiconductor film is processed into the island-shaped oxide semiconductor layer. Oxygen-defect-inducing factors are also introduced into the channel formation region to reduce the resistance (for example, the channel formation region is made to have n⁻ type conductivity) using oxygen defects as donors, whereby electric characteristics of the transistor can be controlled.

Heat treatment (for example, at a temperature higher than or equal to 200° C. and lower than or equal to 600° C.) may be performed after the introducing treatment of oxygen-defect-inducing factors. The introducing treatment of oxygen-defect-inducing factors is preferably performed before the first heat treatment, in which case the heat treatment can also serve as the first heat treatment. For example, by performing introducing treatment of oxygen-defect-inducing factors and heat treatment at a temperature higher than or equal to 200° C. and lower than or equal to 600° C. in a nitrogen atmosphere, the resistance of the intrinsic oxide semiconductor layer can be reduced (the intrinsic oxide semiconductor layer can be made to have n-type conductivity).

The oxide semiconductor layer 620 in this embodiment is a purified oxide semiconductor layer; thus, introduction of introducing oxygen-defect-inducing factors has a great effect on the oxide semiconductor layer 620. Thus, even when the amount of oxygen-defect-inducing factors in the oxide semiconductor layer 620 is small, electric characteristics of the transistor can be effectively controlled.

Next, oxygen-defect-inducing factors 630 are selectively introduced into the oxide semiconductor layer 620 using the gate electrode layer 601, the first source electrode layer 625a, the first drain electrode layer 625b, the second source electrode layer 635a, and the second drain electrode layer 635b as masks, so that a channel formation region 613, oxygen-defect-inducing-factor-containing regions 631a and 631b, and oxygen-defect-inducing-factor-non-introduced regions 611a and 611b are formed (see FIG. 12C). The concentration of the oxygen-defect-inducing factors 630 in each of the oxygen-defect-inducing-factor-containing regions 631a and 631b may be, for example, about $1\times10^{18}$ atoms/cm³.

The oxygen-defect-inducing factors 630 are selectively introduced into the oxide semiconductor layer 620, whereby oxygen defects are effectively induced in the regions into which the oxygen-defect-inducing factors 630 are introduced. The oxygen defects serve as donors; thus, the oxide semiconductor layer including the oxygen-defect-inducing-factor-containing regions 631a and 631b the resistance of which is selectively reduced can be formed.

The oxygen-defect-inducing factors 630 are not introduced into a region which overlaps with the gate electrode layer 601 and the region becomes the channel formation region 613.

The oxygen-defect-inducing factors 630 are not introduced into the oxygen-defect-inducing-factor-non-introduced regions 611a and 611b. However, the regions 611a and 611b are made to have n-type conductivity by the first heat treatment for dehydration or dehydrogenation in an atmosphere of an inert gas such as nitrogen or a rare gas, and thus are n-type low-resistance regions. Thus, the oxide semiconductor layer can be connected to the first source electrode layer 625a or the first drain electrode layer 625b through the n-type low-resistance region.

Next, an insulating layer 609 for covering the oxide semiconductor layer including the channel formation region 613, the oxygen-defect-inducing-factor-containing regions 631a and 631b, and the oxygen-defect-inducing-factor-non-introduced regions 611a and 611b; the first source electrode layer 625a; the first drain electrode layer 625b; the second source electrode layer 635a; the second drain electrode layer 635b; the gate insulating layer 602; and the gate electrode layer 601 is formed.

Next, oxygen-defect-inducing factors 632 are introduced into the oxygen-defect-inducing-factor-containing regions 631a and 631b in the oxide semiconductor layer, so that an oxide semiconductor layer 633 including low-concentration-oxygen-defect-inducing-factor-containing regions 615a and 615b, a source region 614a, a drain region 614b, the channel formation region 613, and the oxygen-defect-inducing-factor-non-introduced regions 611a and 611b is formed (see FIG. 12D). The concentration of the oxygen-defect-inducing factors 632 in each of the source region 614a and the drain region 614b may be, for example, greater than or equal to $1\times10^{19}$ atoms/cm³ and less than or equal to $1\times10^{21}$ atoms/cm³.

Since parts of the insulating layer 609, which are provided on side surfaces of the gate electrode layer 601 also serve as masks, introduction of the oxygen-defect-inducing factors 632 into part of the oxide semiconductor layer 620, which overlaps with the gate electrode layer 601 and the parts of the insulating layer 609, which are provided on the side surfaces of the gate electrode layer 601, is blocked. Accordingly, these parts of the oxide semiconductor layer 620 become the low-concentration-oxygen-defect-inducing-factor-containing regions 615a and 615b. In particular, in this embodiment, the gate electrode layer 601 is thick; thus, introduction of the oxygen-defect-inducing factors 632 into the oxide semiconductor layer 620 is blocked more.

Note that in the case where introducing treatment of oxygen-defect-inducing factors is performed on the channel formation region 613, the oxygen-defect-inducing factors are introduced so that the concentration thereof in the channel formation region 613 is lower than that in each of the low-concentration-oxygen-defect-inducing-factor-containing regions 615a and 615b, the source region 614a, and the drain region 614b. As in this embodiment, in the case where the concentration of oxygen-defect-inducing factors in each of the source region 614a and the drain region 614b is greater than or equal to $1\times10^{19}$ atoms/cm$^3$ and less than or equal to $1\times10^{21}$ atoms/cm$^3$ and the concentration of oxygen-defect-inducing factors in each of the low-concentration-oxygen-defect-inducing-factor-containing regions 615a and 615b is about $1\times10^{18}$ atoms/cm$^3$, the concentration of oxygen-defect-inducing factors in the channel formation region 613 may be, for example, less than $1\times10^{14}$ atoms/cm$^3$.

Through the above-described steps, the transistor 640 can be manufactured (see FIG. 12E).

In the transistor 650 illustrated in FIG. 13C, a region of a gate insulating layer, which does not overlap with the gate electrode layer 601 is removed, and an island-shaped gate insulating layer 604 is formed. Accordingly, the insulating layer 609 is provided in contact with the low-concentration-oxygen-defect-inducing-factor-containing regions 615a and 615b, the source region 614a, and the drain region 614b which are included in the oxide semiconductor layer 633; the first source electrode layer 625a; the first drain electrode layer 625b; the second source electrode layer 635a; the second drain electrode layer 635b; and the gate electrode layer 601.

In a manner similar to that of the transistor 640, after the step illustrated in FIG. 12C, the gate insulating layer is etched using the gate electrode layer 601 as a mask, so that the island-shaped gate insulating layer 604 is formed (see FIG. 13A).

Note that the gate insulating layer may be etched before introducing treatment of oxygen-defect-inducing factors for forming the oxygen-defect-inducing-factor-containing regions 631a and 631b. In that case, oxygen-defect-inducing factors are directly introduced into part of the oxide semiconductor layer 620, which is exposed.

Next, the insulating layer 609 for covering the oxide semiconductor layer including the channel formation region 613, the oxygen-defect-inducing-factor-containing regions 631a and 631b, and the oxygen-defect-inducing-factor-non-introduced regions 611a and 611b; the first source electrode layer 625a; the first drain electrode layer 625b; the second source electrode layer 635a; the second drain electrode layer 635b; the gate insulating layer 604; and the gate electrode layer 601 is formed. Since parts of the gate insulating layer, which are positioned over the oxygen-defect-inducing-factor-containing regions 631a and 631b in the oxide semiconductor layer 633 are removed in FIG. 13A, the insulating layer 609 is formed in contact with the exposed oxygen-defect-inducing-factor-containing regions 631a and 631b.

Next, oxygen-defect-inducing factors 636 are introduced into the oxygen-defect-inducing-factor-containing regions 631a and 631b in the oxide semiconductor layer, so that the oxide semiconductor layer 633 including the low-concentration-oxygen-defect-inducing-factor-containing regions 615a and 615b, the source region 614a, the drain region 614b, the channel formation region 613, and the oxygen-defect-inducing-factor-non-introduced regions 611a and 611b is formed (see FIG. 13B). The concentration of the oxygen-defect-inducing factors 636 in each of the source region 614a and the drain region 614b may be, for example, greater than or equal to $1\times10^{19}$ atoms/cm$^3$ and less than or equal to $1\times10^{21}$ atoms/cm$^3$.

Since parts of the insulating layer 609, which are provided on side surfaces of the gate electrode layer 601 also serve as masks, introduction of the oxygen-defect-inducing factors 636 into parts of the oxide semiconductor layer 620, which overlap with the parts of the insulating layer 609, which are provided on the side surfaces of the gate electrode layer 601, is blocked. Accordingly, the parts of the oxide semiconductor layer 620 become the low-concentration-oxygen-defect-inducing-factor-containing regions 615a and 615b. In particular, in this embodiment, the gate electrode layer 601 is thick, and furthermore, the gate insulating layer 604 is formed; thus, introduction of the oxygen-defect-inducing factors 632 into the oxide semiconductor layer 620 is blocked more.

Through the above-described steps, the transistor 650 can be manufactured.

As the oxygen-defect-inducing factors 630, 632, and 636, one or more elements selected from titanium (Ti), tungsten (W), molybdenum (Mo), aluminum (Al), cobalt (Co), zinc (Zn), indium (In), silicon (Si), and boron (B) can be used. In addition to the above oxygen-defect-inducing factors, hydrogen and/or nitrogen can be used. Note that metal elements with a high oxygen affinity are preferably used as the oxygen-defect-inducing factors 630, 632, and 636.

In the transistors 640 and 650 each of which includes the oxide semiconductor layer 633 including the low-concentration-oxygen-defect-inducing-factor-containing regions 615a and 615b and the source region 614a and the drain region 614b which are high-concentration-oxygen-defect-inducing-factor-containing regions the resistance of which is reduced by introducing the oxygen-defect-inducing factors, contact resistance between the oxide semiconductor layer 633 and the first source electrode layer 625a and between the oxide semiconductor layer 633 and the first drain electrode layer 625b can be reduced; thus, on-state characteristics (e.g., on-state current or field-effect mobility) are improved. Thus, the transistor can have good electric characteristics.

The transistor with good electric characteristics is capable of high-speed response and high-speed operation. Thus, the semiconductor device including the transistor can have high performance.

Furthermore, the oxide semiconductor layer in which the conductivity varies from part to part is provided, whereby electric field concentration of the transistor can be suppressed and a high electric field can be prevented from being locally applied. Thus, the withstand voltage of the transistor can be improved, which results in high reliability of a semiconductor device.

This embodiment can be implemented in appropriate combination with any of the other embodiments.

(Embodiment 5)

A semiconductor device and a method for manufacturing the semiconductor device will be described with reference to FIGS. 4A to 4D. Note that same portions as in Embodiment 1 or 2 and portions having functions similar to those of the portions in Embodiment 1 or 2 are formed in a manner similar to that of Embodiment 1 or 2 and steps similar to those in Embodiment 1 or 2 can be performed in a manner similar to that of Embodiment 1 or 2, and the description thereof is not repeated.

First, an insulating layer 407 is formed over a substrate 400. Then, a first oxide semiconductor layer is formed over the insulating layer 407 and a region including at least a surface of the first oxide semiconductor layer is crystallized by first heat treatment, so that a first oxide semiconductor layer 450a is formed (see FIG. 4A).

The first oxide semiconductor layer 450a formed over the insulating layer 407 is a three-component metal oxide and may be formed using an oxide semiconductor material which is represented by the chemical formula, $InM_XZn_YO_Z$ (Y=0.5 to 5). Here, M represents one or more kinds of elements selected from Group 13 elements such as gallium (Ga), aluminum (Al), or boron (B). Note that the Zn content and O content are set freely. The value of the M content may be zero (i.e., X=0). In contrast, the value of the In content and that of the Zn content are not zero. In other words, the above expression includes In—Ga—Zn—O, In—Zn—O, and the like.

Besides, for the first oxide semiconductor layer 450a, an In—Sn—Ga—Zn—O-based oxide semiconductor which is a four-component metal oxide; an In—Sn—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor can be used.

In this embodiment, the first oxide semiconductor layer 450a is formed by a sputtering method with the use of an In—Ga—Zn—O-based oxide semiconductor target.

It is preferable that the relative density of the oxide semiconductor in the oxide semiconductor target be greater than or equal to 80%, more preferably greater than or equal to 95%, further preferably greater than or equal to 99.9%. The first oxide semiconductor layer 450a can be dense by being formed using an oxide semiconductor target with high relative density. In addition, in this embodiment, the first oxide semiconductor layer 450a is intentionally crystallized by performing heat treatment in a later step; thus, an oxide semiconductor target which allows crystallization to be easily caused is preferably used.

An atmosphere for formation of the first oxide semiconductor layer 450a is preferably a rare gas (typically argon) atmosphere, an oxygen atmosphere, or a mixed atmosphere of a rare gas (typically argon) and oxygen. Specifically, a high-purity gas atmosphere from which impurities such as hydrogen, water, a hydroxyl group, and hydride have been removed is preferably used, for example.

When the first oxide semiconductor layer 450a is formed, for example, a substrate is held in a treatment chamber kept under reduced pressure and the substrate temperature is set to higher than or equal to 200° C. and lower than or equal to 600° C. Then, a sputtering gas from which hydrogen and water have been removed is introduced while moisture which remains in the treatment chamber is removed, and the first oxide semiconductor layer 450a is formed using metal oxide as a target. The first oxide semiconductor layer 450a is formed while the substrate is heated, whereby impurities contained in the first oxide semiconductor layer 450a can be reduced. In addition, damage due to sputtering can be reduced. It is preferable that moisture or the like which remains in a sputtering apparatus is removed before, during, or after formation of the first oxide semiconductor layer 450a. In order to remove moisture which remains in the treatment chamber, an entrapment vacuum pump such as a cryopump is preferably used. From the treatment chamber which is evacuated with a cryopump, hydrogen or water is removed, whereby the concentration of impurities in the first oxide semiconductor layer 450a can be reduced.

Note that before the first oxide semiconductor layer 450a is formed, preheat treatment is preferably performed in order to remove moisture or the like which remains in the sputtering apparatus. As examples of the preheat treatment, a method in which the inside of a film formation chamber is heated to a temperature higher than or equal to 200° C. and lower than or equal to 600° C. under reduced pressure, a method in which introduction and exhaust of nitrogen or an inert gas are repeated while the inside of the film formation chamber is heated, and the like can be given. After the preheat treatment, the substrate or the sputtering apparatus is cooled. Then, the oxide semiconductor layer is formed without being exposed to air. In that case, not water but oil or the like is preferably used as a coolant for the target. Although a certain level of effect can be obtained when introduction and exhaust of nitrogen are repeated without heating, it is more preferable to perform the treatment with the inside of the film formation chamber is heated.

The first oxide semiconductor layer 450a can be formed under the following conditions, for example: the distance between the substrate and the target is 170 mm, the pressure is 0.4 Pa, the direct-current (DC) power is 0.5 kW, and the atmosphere is an oxygen atmosphere. Note that pulsed direct-current (DC) power source is preferably used, in which case dust (powder or flake-like substances formed at the time of the film formation) can be reduced and the film thickness can be uniform. The thickness of the first oxide semiconductor layer 450a is preferably greater than or equal to 3 nm and less than or equal to 15 nm, and is, for example, 5 nm in this embodiment. Note that the appropriate thickness of the first oxide semiconductor layer 450a varies depending on the oxide semiconductor material to be used, the usage, or the like; therefore, the thickness may be determined as appropriate in accordance with the material, the usage, or the like.

The temperature of the first heat treatment is higher than or equal to 450° C. and lower than or equal to 850° C., preferably higher than or equal to 550° C. and lower than or equal to 750° C. In addition, heating time is longer than or equal to 1 minute and shorter than or equal to 24 hours. In this embodiment, as the first heat treatment, heat treatment is performed at 700° C. in a nitrogen atmosphere for one hour so that dehydration or dehydrogenation is performed, and then the atmosphere is switched to an oxygen atmosphere so that oxygen is supplied to the inside of the first oxide semiconductor layer 450a. In addition, water (including a hydroxyl group), hydrogen, or the like contained in the first oxide semiconductor layer 450a can be removed by the first heat treatment.

Note that it is preferable that in the first heat treatment, water, hydrogen, and the like be not contained in nitrogen, oxygen or a rare gas such as helium, neon, or argon. In addition, nitrogen, oxygen, or a rare gas such as helium, neon, or argon which is introduced into a heat treatment apparatus preferably has a purity of 6N (99.9999%) or higher, more preferably 7N (99.99999%) or higher (that is, the concentration of an impurity is lower than or equal to 1 ppm, preferably lower than or equal to 0.1 ppm). Alternatively, the first heat treatment may be performed in ultra-dry air with an $H_2O$ concentration of 20 ppm or less, more preferably 1 ppm or less. Water (including a hydroxyl group), hydrogen, or the like contained in the first oxide semiconductor layer 450a can be removed by such first heat treatment.

By the first heat treatment, the first oxide semiconductor layer 450a which includes a crystalline region (non-single-crystal region) in a region including at least the surface thereof is formed. The crystalline region formed in the region including the surface is formed by crystal growth proceeding from the surface toward the inside. The crystalline region includes a plate-like crystal with an average thickness of greater than or equal to 2 nm and less than or equal to 10 nm. The crystalline region includes a crystal whose c-axis is aligned in a direction substantially perpendicular to the surface. Here, the "substantially perpendicular" means a state within ±10° from a perpendicular direction.

Figure 4A:
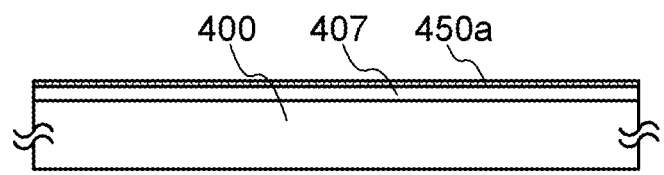
FIGS. 4A to 4D illustrate one embodiment of a semiconductor device and a method for manufacturing the semiconductor device.
Figure 4B:
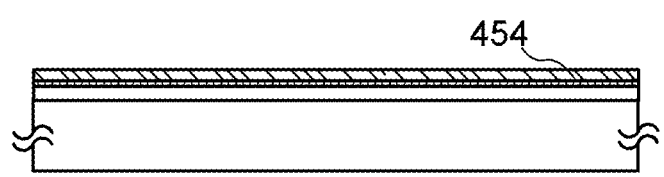

Note that the apparatus used for the first heat treatment is not limited to a particular apparatus, and an apparatus for heating an object to be processed with the use of heat radiation or heat conduction from a heating element such as a resistance heating element, or the like can be used Next, a second oxide semiconductor layer 454 is formed over the first oxide semiconductor layer 450a which includes the crystalline region in the region including at least the surface (see FIG. 4B).

The second oxide semiconductor layer 454 can be formed in a manner similar to that of the first oxide semiconductor layer 450a, with the use of an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; an In—O-based oxide semiconductor, a Sn—O-based oxide semiconductor, or a Zn—O-based oxide semiconductor.

It is preferable that the second oxide semiconductor layer 454 be formed using a material whose main component is the same as that of the material of the first oxide semiconductor layer 450a or that the second oxide semiconductor layer 454 have the same crystal structure as the first oxide semiconductor layer 450a and a lattice constant similar to that of the first oxide semiconductor layer 450a (a mismatch of 1% or less).

In the case of using materials containing the same main components, crystal growth is easily caused in later crystallization of the second oxide semiconductor layer 454 by using the crystalline region of the first oxide semiconductor layer 450a as a seed. In addition, when materials containing the same main component are used, the effective thickness can be increased; thus, the use of materials containing the same main component is suitable for application to power devices or the like. In addition, in the case of using materials containing the same main component, favorable interface properties such as adhesiveness or favorable electric characteristics can be obtained.

In this embodiment, the second oxide semiconductor layer 454 is formed by a sputtering method with the use of an In—Ga—Zn—O-based oxide semiconductor target. The formation of the second oxide semiconductor layer 454 by a sputtering method may be performed in a manner similar to the above-described formation of the first oxide semiconductor layer 450a by a sputtering method. Note that the thickness of the second oxide semiconductor layer 454 is preferably larger than that of the first oxide semiconductor layer 450a. The second oxide semiconductor layer 454 is preferably formed so that the sum of the thickness of the first oxide semiconductor layer 450a and that of the second oxide semiconductor layer 454 is greater than or equal to 3 nm and less than or equal to 50 nm. Note that the appropriate thickness varies depending on the oxide semiconductor material to be used, the usage, or the like; therefore, the thickness may be determined as appropriate in accordance with the material, the usage, or the like.

Next, second heat treatment is performed on the second oxide semiconductor layer 454 to cause crystal growth using the crystalline region of the first oxide semiconductor layer 450a as a seed. Thus, a second oxide semiconductor layer 450b is formed (see FIG. 4C).

The second heat treatment is performed at a temperature higher than or equal to 450° C. and lower than or equal to 850° C., preferably higher than or equal to 600° C. and lower than or equal to 700° C. for a period longer than or equal to 1 minute and shorter than or equal to 400 hours, preferably longer than or equal to 5 hours and shorter than or equal to 20 hours, typically 10 hours.

Note that it is preferable also in the second heat treatment, water, hydrogen, and the like be not contained in nitrogen, oxygen or a rare gas such as helium, neon, or argon. It is preferable that nitrogen, oxygen, or a rare gas such as helium, neon, or argon introduced into a heat treatment apparatus have a purity of greater than or equal to 6N, preferably greater than or equal to 7N. Alternatively, the second heat treatment may be performed in ultra-dry air with an $H_2O$ concentration of 20 ppm or lower, more preferably 1 ppm or lower. Water (including a hydroxyl group), hydrogen, or the like contained in the second oxide semiconductor layer 450b can be removed by such a second heat treatment. Accordingly, the first oxide semiconductor layer 450a and the second oxide semiconductor layer 450b which are made to be i-type or substantially i-type by reducing impurities and increasing the purity can be formed.

In addition, when the temperature is raised in the second heat treatment, the inside of a furnace may be set to a nitrogen atmosphere, and when the temperature is decreased, the inside of the furnace may be switched to an oxygen atmosphere. By performing crystallization (this step also serves as a dehydration step or a dehydrogenation step) in a nitrogen atmosphere and then switching the atmosphere to an oxygen atmosphere, oxygen can be supplied to the inside of the second oxide semiconductor layer 450b.

In this manner, the second heat treatment is performed, whereby the entire region of the second oxide semiconductor layer 454 is crystallized from the crystalline region formed at the interface between the second oxide semiconductor layer 454 and the first oxide semiconductor layer 450a; thus, the second oxide semiconductor layer 450b can be formed. In addition, by the second heat treatment, a crystalline layer of the first oxide semiconductor layer 450a can include highly-aligned crystals.

For example, in the case where an In—Ga—Zn—O-based oxide semiconductor material is used for the second oxide semiconductor layer 450b, the second oxide semiconductor layer 450b can include a crystal represented by $InGaO_3(ZnO)_m$ (m>0 and m is not limited to a natural number), a crystal represented by $In_2Ga_2ZnO_7$ (In:Ga:Zn:O=2:2:1:7), or the like. Owing to the second heat treatment, the c-axis of such a crystal is aligned in a direction substantially perpendicular to the surfaces of the first oxide semiconductor layer 450a and the second oxide semiconductor layer 450b.

Here, the above-described crystal contains any of In, Ga, and Zn, and can be considered to have a stacked structure of layers parallel to the a-axis and the b-axis. Specifically, the above-described crystal has a structure in which a layer containing In and a layer not containing In (a layer containing Ga or Zn) are stacked in the c-axis direction.

In the In—Ga—Zn—O-based oxide semiconductor crystal, the conductivity of the layer containing In in a direction parallel to the a-axis and b-axis is favorable. This is because of the fact that electric conductivity is mainly controlled by In in the In—Ga—Zn—O-based oxide semiconductor crystal and the fact that the 5s orbital of one In atom overlaps with the 5s orbital of an adjacent In atom, whereby a carrier path is formed.

In the case where the first oxide semiconductor layer 450a includes an amorphous region at the interface between the first oxide semiconductor layer 450a and the insulating layer 407, the second heat treatment might cause crystal growth which proceeds from the crystalline region formed on the surface of the first oxide semiconductor layer 450a toward the bottom surface of the first oxide semiconductor layer and might crystallize the amorphous region. Note that the amorphous region might remain depending on the material for forming the insulating layer 407, heat treatment conditions, or the like.

Figure 4C:
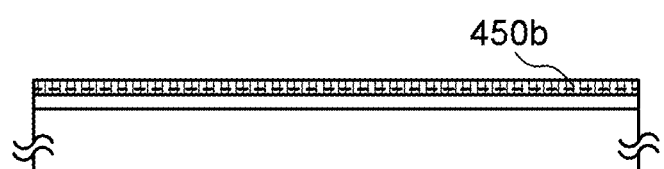

In the case where the first oxide semiconductor layer 450a and the second oxide semiconductor layer 454 are formed using oxide semiconductor materials containing the same main components, as illustrated in FIG. 4C, crystals grow upward to the surface of the second oxide semiconductor layer 454 by using the first oxide semiconductor layer 450a as a seed crystal of the crystal growth, so that the second oxide semiconductor layer 450b is formed and the first oxide semiconductor layer 450a and the second oxide semiconductor layer 450b have the same crystal structure. Therefore, although the boundary between the first oxide semiconductor layer 450a and the second oxide semiconductor layer 450b is indicated by a dotted line in FIG. 4C, it sometimes cannot be distinguished, and the first oxide semiconductor layer 450a and the second oxide semiconductor layer 450b can be sometimes regarded as one layer.

Note that a heat treatment apparatus for the second heat treatment can be used under conditions similar to those of the first heat treatment.

Figure 4D:
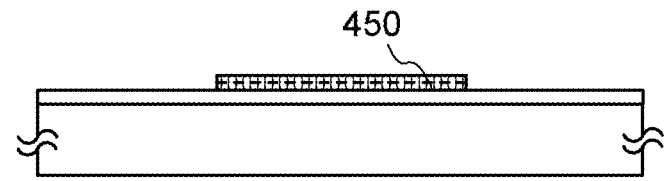

Next, the first oxide semiconductor layer 450a and the second oxide semiconductor layer 450b are processed into an island shape by a method such as etching using a mask, so that an island-shaped oxide semiconductor layer 450 is formed (see FIG. 4D).

The formed island-shaped oxide semiconductor layer 450 is used and the manufacturing methods described in Embodiments 1 to 3 are used in combination with the manufacturing method in this embodiment, whereby a transistor according to one embodiment of the present invention can be manufactured.

As described in this embodiment, the oxide semiconductor layer is formed through two deposition steps and two heat treatment steps, whereby a thick crystalline region (non-single-crystal region), that is, a crystalline region the c-axis of which is aligned in a direction perpendicular to a surface of the layer can be formed even when any of an oxide, a nitride, a metal, or the like is used as a material for a base component. Note that in the case where a general silicon semiconductor is used, a crystalline structure is broken and the resistivity is significantly increased after ion implantation, and for that reason, the crystallinity needs to be recovered by heat treatment. Also in this embodiment, a crystalline structure in part of an oxide semiconductor, into which oxygen-defect-inducing factors are implanted by ion implantation is broken, so that the oxide semiconductor is in an amorphous state. However, even when the oxide semiconductor is in an amorphous state, sufficient conductivity can be obtained as long as sufficient carriers exist; thus, annealing after the ion implantation is not needed.

The transistor which includes the oxide semiconductor layer including such a crystalline region can have good on-state characteristics such as high field-effect mobility. In addition, the transistor can have low off-state current.

Note that this embodiment can be implemented in appropriate combination with any of the other embodiments.

(Embodiment 6)

A semiconductor device (also referred to as a display device) with a display function can be manufactured using the transistor an example of which is described in any of Embodiments 1 to 5 in a pixel portion and further in a driver circuit. Further, part or whole of a driver circuit can be formed over the same substrate as a pixel portion with the use of a transistor, whereby a system-on-panel can be obtained.

A variety of display devices each including a display element can be provided using the transistor an example of which is described in any of Embodiments 1 to 5. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 5A:
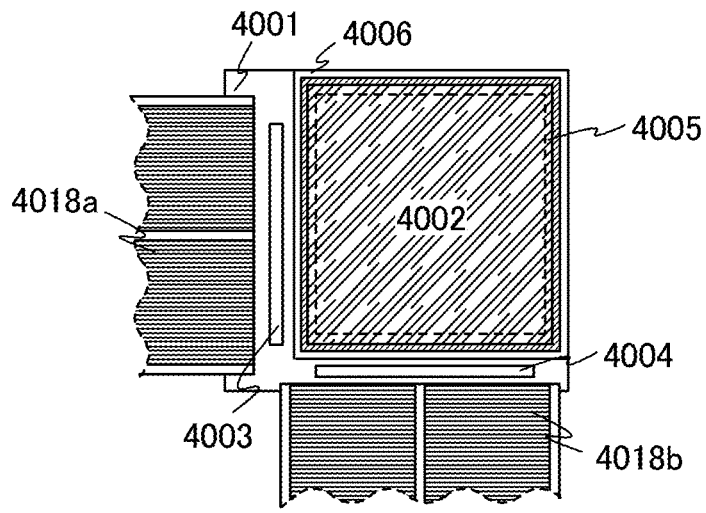
FIGS. 5A to 5C each illustrate one embodiment of a semiconductor device.

In FIG. 5A, a sealant 4005 is provided so as to surround a pixel portion 4002 provided over a first substrate 4001, and the pixel portion 4002 is sealed between the first substrate 4001 and the second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004 each of which is separately formed, and the pixel portion 4002 from flexible printed circuits (FPCs) 4018a and 4018b.

Figure 5B:
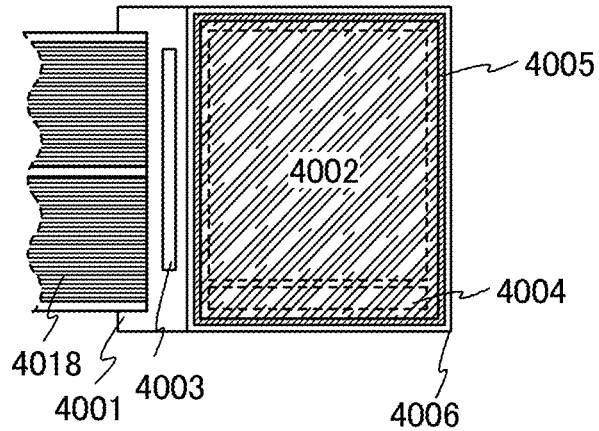
Figure 5C:
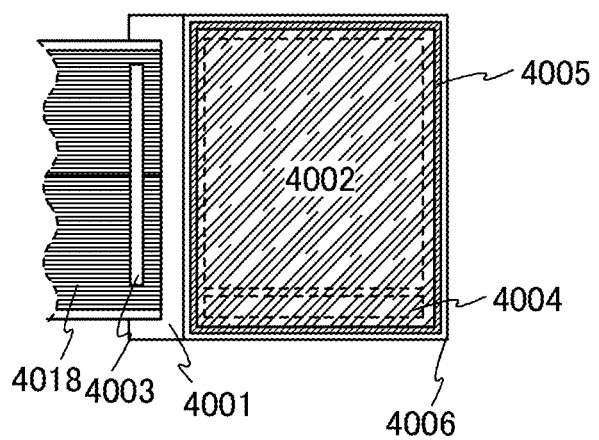

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 as well as a display element are sealed by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, various signals and potential are supplied to the signal line driver circuit 4003 which is separately formed, the scan line driver circuit 4004, and the pixel portion 4002 from an FPC 4018.

Although FIGS. 5B and 5C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

The display device includes a panel in which the display element is sealed, and a module in which an IC or the like including a controller is mounted on the panel.

Note that a display device in this specification refers to an image display device, a display device, or a light source (including a lighting device). Further, the display device includes the following modules in its category: a module to which a connector such as an FPC, a TAB tape, or a TCP is attached; a module having a TAB tape or a TCP which is provided with a printed wiring board at the end thereof; and a module having an integrated circuit (IC) which is directly mounted on a display element by a COG method.

The pixel portion 4002 and the scan line driver circuit 4004 which are provided over the first substrate 4001 includes a plurality of transistors. The transistor an example of which is described in any of Embodiments 1 to 5 can be used as the transistor.

In the case where a liquid crystal element is used as a display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like is used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor layer particularly has a possibility that electric characteristics of the transistor may fluctuate significantly by the influence of static electricity and deviate from the designed range. Therefore, it is more effective to use a blue phase liquid crystal material for a liquid crystal display device which includes a transistor including an oxide semiconductor layer.

The specific resistivity of a liquid crystal material is greater than or equal to $1\times10^9$ $\Omega$·cm, preferably greater than or equal to $1\times10^{11}$ $\Omega$·cm, more preferably greater than or equal to $1\times10^{14}$ $\Omega$·cm. Note that the specific resistivity in this specification is measured at 20° C.

The capacitance of a storage capacitor provided in a liquid crystal display device is set in consideration of leakage current or the like of a transistor placed in a pixel portion so that charges can be held for a predetermined period. The capacitance of the storage capacitor may be set in consideration of off-state current or the like of the transistor. The transistor described in Embodiment 4 or 5 which includes a high-purity oxide semiconductor layer is used, so that it is only necessary to provide a storage capacitor having capacitance which is ⅓ or less, preferably ⅕ or less of liquid crystal capacitance in each pixel.

For the liquid crystal display device, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (Optical Compensated Birefringence) mode, an FLC (ferroelectric liquid crystal) mode, an AFLC (anti ferroelectric liquid crystal) mode, or the like can be used.

A normally black liquid crystal display device such as a transmissive liquid crystal display device utilizing a vertical alignment (VA) mode is also preferable. Some examples of the vertical alignment mode are given. For example, a multi-domain vertical alignment (MVA) mode, a patterned vertical alignment (PVA) mode, an ASV mode, or the like can be used.

Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Color elements controlled in a pixel at the time of color display are not limited to three colors: R, G, and B (R, G, and B correspond to red, green, and blue, respectively. For example, R, G, B, and W (W corresponds to white); R, G, B, and one or more of yellow, cyan, magenta, and the like; or the like can be used. The sizes of display regions may be different between respective dots of color elements. The present invention is not limited to the application to a display device for color display but can also be applied to a display device for monochrome display.

A light-emitting element utilizing electroluminescence can be used as the display element included in the display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be made to be thin and light.

A variety of modes can be considered as an electrophoresis display device of this embodiment, but the electrophoresis display device of this embodiment is a device in which a plurality of microcapsules each including first particles having a positive charge and second particles having a negative charge are dispersed in a solvent or a solute, and an electrical field is applied to the microcapsules so that the particles in the microcapsules move in opposite directions of each other, and only a color of the particles gathered on one side is displayed. Note that the first particles and the second particles each contain pigment and do not move without an electric field. Moreover, the first particles and the second particles have different colors (which may be colorless).

In this way, an electrophoretic display device is a display that utilizes a so-called dielectrophoretic effect by which a substance that has a high dielectric constant move to a region in which there is a high electric field.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device in which a twisting ball display system is used can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, whereby display is performed.

Any of the transistors described in Embodiments 1 to 5 is used for the display device which is described above as an example, whereby the display device can have a variety of functions.

This embodiment can be implemented in appropriate combination with any of the other embodiments.
(Embodiment 7)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 6A:
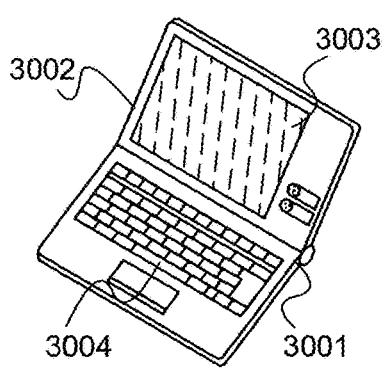
FIGS. 6A to 6F each illustrate an electronic device.

FIG. 6A illustrates a note book personal computer which is manufactured by mounting at least the semiconductor device described in any of Embodiments 1 to 6 as a component and includes a main body 3001, a housing 3002, a display portion 3003, a keyboard 3004, and the like.

Figure 6B:
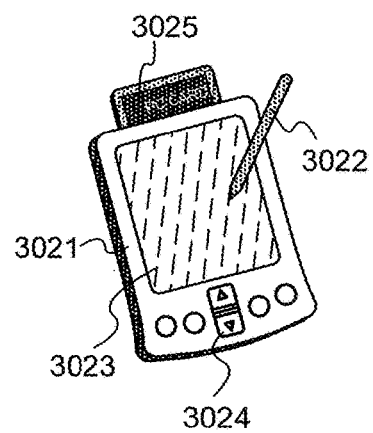

FIG. 6B illustrates a portable information terminal device (PDA)) which is manufactured by mounting at least the semiconductor device described in any of Embodiments 1 to 6 as a component and includes a main body 3021 is provided with a display portion 3023, an external interface 3025, an operation button 3024, and the like. A stylus 3022 is included as an accessory for operation.

Figure 6C:
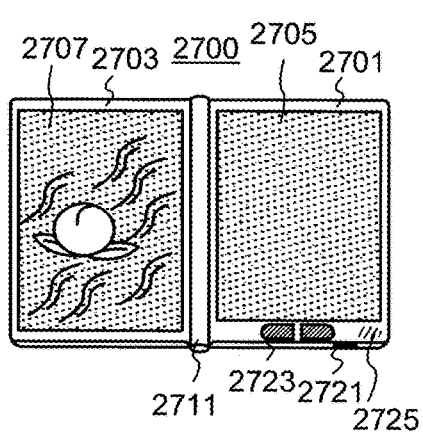

Further, the semiconductor device described in any of Embodiments 1 to 6 can be applied to an electronic paper. FIG. 6C illustrates an e-book reader manufactured by mounting the electronic paper as a component. FIG. 6C illustrates an example of an e-book reader. For example, the e-book reader 2700 includes two housings: a housing 2701 and a housing 2703. The housing 2701 and the housing 2703 are combined with a hinge 2711 so that the e-book reader 2700 can be opened and closed with the hinge 2711 as an axis. Such a structure allows the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 6C) can display text and a display portion on the left (the display portion 2707 in FIG. 6C) can display graphics.

FIG. 6C illustrates an example in which the housing 2701 is provided in an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (e.g., an earphone terminal or a USB terminal), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 6D:
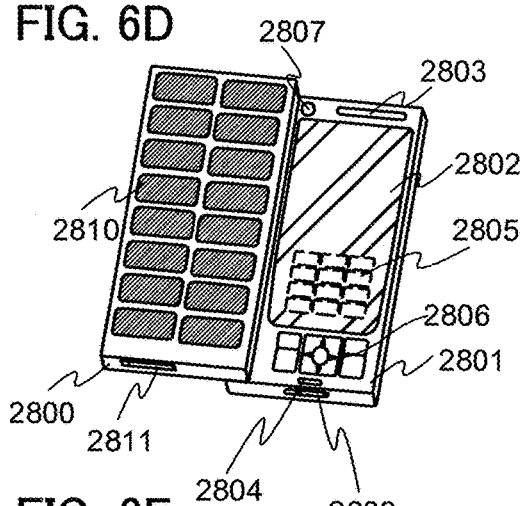

FIG. 6D illustrates a mobile phone which is manufactured by mounting at least the semiconductor device described in any of Embodiments 1 to 6 as a component and includes two housings: a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 for charging of the portable phone, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 6D. Note that a booster circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, sound recording, and playback as well as voice calls. Moreover, the housings 2800 and 2801 in a state where they are developed as illustrated in FIG. 6D can shift by sliding so that one is lapped over the other; therefore, the size of the cellular phone can be reduced, which makes the cellular phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 6E:
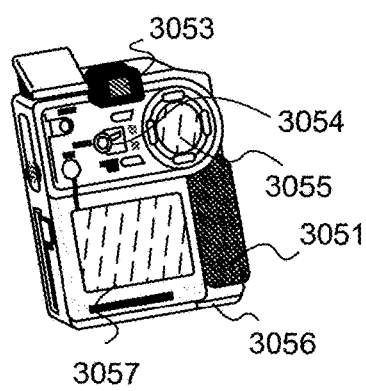

FIG. 6E illustrates a digital video camera which is manufactured by mounting at least the semiconductor device described in any of Embodiments 1 to 6 as a component and includes a main body 3051, a display portion A 3057, an eyepiece 3053, an operation switch 3054, a display portion B 3055, a battery 3056, and the like.

Figure 6F:
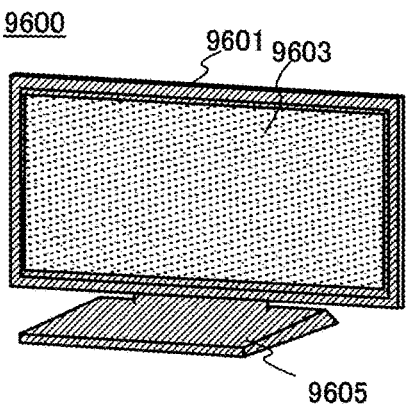

FIG. 6F illustrates an example of a television set which is manufactured by mounting at least the semiconductor device described in any of Embodiments 1 to 6 as a component. In a television set 9600, a display portion 9603 is incorporated in a housing 9601. The display portion 9603 can display images. Here, the housing 9601 is supported by a stand 9605.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be freely combined with any of Embodiments 1 to 6.

This application is based on Japanese Patent Application serial no. 2009-288428 filed with Japan Patent Office on Dec. 18, 2009, the entire contents of which are hereby incorporated by reference.

EXPLANATION OF REFERENCE

400: substrate, 401: gate electrode layer, 402: gate insulating layer, 403: oxide semiconductor layer, 405a: source electrode layer, 405b: drain electrode layer, 407: insulating layer, 409: insulating layer, 410: transistor, 411: insulating layer, 413: channel formation region, 414a: source region, 414b: drain region, 415a: low-concentration-oxygen-defect-inducing-factor-containing region, 415b: low-concentration-oxygen-defect-inducing-factor-containing region, 420: oxide semiconductor layer, 421: oxygen-defect-inducing factor, 430: oxygen-defect-inducing factor, 431a: oxygen-defect-inducing-factor-containing region, 431b: oxygen-defect-inducing-factor-containing region, 432: oxygen-defect-inducing factor, 433: oxide semiconductor layer, 434: oxygen-defect-inducing factor, 440: transistor, 450: oxide semiconductor layer, 450a: first oxide semiconductor layer, 450b: second oxide semiconductor layer, 454: second oxide semiconductor layer, 500: substrate, 501: gate electrode layer, 502: gate insulating layer, 503: oxide semiconductor layer, 507: insulating layer, 510: transistor, 511a: oxygen-defect-inducing-factor-non-introduced region, 511b: oxygen-defect-inducing-factor-non-introduced region, 512a: source region, 512b: drain region, 513: channel formation region, 520: oxide semiconductor layer, 521: oxygen-defect-inducing factor, 545a: second source electrode layer, 545b: second drain electrode layer, 555a: first source electrode layer, 555b: first drain electrode layer, 600: substrate, 601: gate electrode layer, 602: gate insulating layer, 604: gate insulating layer, 607: insulating layer, 609: insulating layer, 611a: oxygen-defect-inducing-factor-non-introduced region, 611b: oxygen-defect-inducing-factor-non-introduced region, 613: channel formation region, 614a: source region, 614b: drain region, 615a: low-concentration-oxygen-defect-inducing-factor-containing region, 615b: low-concentration-oxygen-defect-inducing-factor-containing region, 620: oxide semiconductor layer, 625a: first source electrode layer, 625b: first drain electrode layer, 630: oxygen-defect-inducing factor, 631a: oxygen-defect-inducing-factor-containing region, 631b: oxygen-defect-inducing-factor-containing-region, 632: oxygen-defect-inducing factor, 633: oxide semiconductor layer, 635a: second source electrode layer, 635b: second drain electrode layer, 636: oxygen-defect-inducing factor, 640: transistor, 650: transistor, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: housing, 3022: stylus, 3023: display portion, 3024: operation button, 3025: external interface, 3051: main body, 3053: eyepiece, 3054: operation switch, 3055: display portion B, 3056: battery, 3057: display portion A, 4001: first substrate, 4002: pixel portion, 4003: signal line driver circuit, 4004: scan line driver circuit, 4005: sealant, 4006: second substrate, 4018: FPC, 4018*a*: FPC, 4018*b*: FPC, 9600: television set, 9601: housing, 9603: display portion, and 9605: stand.

The invention claimed is:

1. A method for manufacturing a semiconductor device comprising:
    forming a first oxide semiconductor layer by a sputtering method;
    crystallizing a region of the first oxide semiconductor layer by a first heat treatment, the region including a surface of the first oxide semiconductor layer;
    forming a second oxide semiconductor layer over the first oxide semiconductor layer by a sputtering method;
    crystallizing the second oxide semiconductor layer by a second heat treatment;
    wherein the second oxide semiconductor layer includes In, Ga, and Zn, and
    wherein the second oxide semiconductor layer includes a crystal whose c-axis is aligned in a direction perpendicular to a surface of the second oxide semiconductor layer.

2. The semiconductor device according to claim 1,
    wherein the first heat treatment is performed at higher than or equal to 450° C. and lower than or equal to 850° C. for greater than or equal to 1 minute and less than or equal to 24 hours, and
    wherein the second heat treatment is performed at higher than or equal to 450° C. and lower than or equal to 850° C. for greater than or equal to 1 minute and less than or equal to 400 hours.

3. A method for manufacturing a semiconductor device comprising:
    forming a first oxide semiconductor layer by a sputtering method;
    heating the first oxide semiconductor layer;
    forming a second oxide semiconductor layer over the first oxide semiconductor layer by a sputtering method;
    heating the second oxide semiconductor layer;
    wherein the second oxide semiconductor layer includes In, Ga, and Zn, and
    wherein the second oxide semiconductor layer includes a crystal whose c-axis is aligned in a direction perpendicular to a surface of the second oxide semiconductor layer.

* * * * *